(12) United States Patent
Kamemoto et al.

(10) Patent No.: US 10,324,376 B2
(45) Date of Patent: Jun. 18, 2019

(54) NEGATIVE TYPE COLORED PHOTOSENSITIVE RESIN COMPOSITION, CURED FILM, ELEMENT, AND DISPLAY DEVICE

(71) Applicant: TORAY INDUSTRIES, INC., Tokyo (JP)

(72) Inventors: Satoshi Kamemoto, Otsu (JP); Yugo Tanigaki, Otsu (JP); Kazuto Miyoshi, Otsu (JP)

(73) Assignee: TORAY INDUSTRIES, INC., Tokyo (JP)

(*) Notice: Subject to any disclaimer, the term of this patent is extended or adjusted under 35 U.S.C. 154(b) by 0 days.

(21) Appl. No.: 15/760,756

(22) PCT Filed: Sep. 21, 2016

(86) PCT No.: PCT/JP2016/077876
§ 371 (c)(1),
(2) Date: Mar. 16, 2018

(87) PCT Pub. No.: WO2017/057143
PCT Pub. Date: Apr. 6, 2017

(65) Prior Publication Data
US 2018/0267405 A1  Sep. 20, 2018

(30) Foreign Application Priority Data
Sep. 30, 2015 (JP) .................... 2015-193003

(51) Int. Cl.
*C08G 69/32* (2006.01)
*G03F 7/038* (2006.01)
*G03F 7/031* (2006.01)
*G03F 7/037* (2006.01)
(Continued)

(52) U.S. Cl.
CPC .......... *G03F 7/0387* (2013.01); *C08G 69/32* (2013.01); *C08G 73/1039* (2013.01);
(Continued)

(58) Field of Classification Search
None
See application file for complete search history.

(56) References Cited

U.S. PATENT DOCUMENTS

2004/0197703 A1   10/2004   Miyoshi et al.
2006/0159839 A1   7/2006   Suwa
(Continued)

FOREIGN PATENT DOCUMENTS

CN   103975274 A   8/2014
JP   2004-326094 A   11/2004
(Continued)

OTHER PUBLICATIONS

International Search Report, issued in PCT/JP2016/077876, PCT/ISA/210, dated Dec. 20, 2016.
(Continued)

*Primary Examiner* — Benjamin P Sandvik
(74) *Attorney, Agent, or Firm* — Birch, Stewart, Kolasch & Birch, LLP

(57) ABSTRACT

The present invention provides a negative type colored photosensitive resin composition that serves to produce a cured film having a forward tapered shape. This negative type colored photosensitive resin composition includes an alkali-soluble resin (A), a photo initiator (B), a photo polymerizable compound (C), and a coloring agent (D), the alkali-soluble resin (A) containing a polyimide precursor, polybenzoxazole precursor, and/or a copolymer thereof (A-1), each resin (A-1) having a trifluoromethyl group in the backbone chain.

15 Claims, 2 Drawing Sheets

(51) Int. Cl.

| | | |
|---|---|---|
| *G03F 7/004* | (2006.01) | |
| *G03F 7/16* | (2006.01) | |
| *G03F 7/20* | (2006.01) | |
| *G03F 7/26* | (2006.01) | |
| *G03F 7/40* | (2006.01) | |
| *H01L 27/32* | (2006.01) | |
| *G03F 7/00* | (2006.01) | |
| *G03F 7/105* | (2006.01) | |
| *C09K 19/04* | (2006.01) | |
| *C09D 179/04* | (2006.01) | |
| *C09D 179/08* | (2006.01) | |
| *C08G 73/10* | (2006.01) | |
| *C08G 73/14* | (2006.01) | |
| *C08G 73/22* | (2006.01) | |

(52) U.S. Cl.
CPC ..... *C08G 73/1053* (2013.01); *C08G 73/1071* (2013.01); *C08G 73/14* (2013.01); *C08G 73/22* (2013.01); *C09D 179/04* (2013.01); *C09D 179/08* (2013.01); *C09K 19/04* (2013.01); *G03F 7/0007* (2013.01); *G03F 7/0046* (2013.01); *G03F 7/0048* (2013.01); *G03F 7/031* (2013.01); *G03F 7/037* (2013.01); *G03F 7/105* (2013.01); *G03F 7/16* (2013.01); *G03F 7/20* (2013.01); *G03F 7/26* (2013.01); *G03F 7/40* (2013.01); *H01L 27/3258* (2013.01)

(56) References Cited

U.S. PATENT DOCUMENTS

| | | | |
|---|---|---|---|
| 2007/0082968 A1 | 4/2007 | Minamisawa et al. | |
| 2008/0108723 A1 | 5/2008 | Taniguchi et al. | |
| 2009/0263745 A1* | 10/2009 | Sakayori | C08G 73/10 430/281.1 |
| 2011/0284855 A1* | 11/2011 | Miyoshi | C08G 73/10 257/59 |
| 2013/0266778 A1* | 10/2013 | Ishizeki | G02B 5/201 428/195.1 |
| 2015/0044451 A1 | 2/2015 | Kido et al. | |

FOREIGN PATENT DOCUMENTS

| | | |
|---|---|---|
| JP | 2007-119728 A | 5/2007 |
| JP | 2009-9107 A | 1/2009 |
| JP | 2009-48170 A | 3/2009 |
| JP | 2011-17976 A | 1/2011 |
| WO | WO 2004/109403 A1 | 12/2004 |
| WO | WO 2006/098291 A1 | 9/2006 |

OTHER PUBLICATIONS

Written Opinion of the International Searching Authority, issued in PCT/JP2016/077876, PCT/ISA/237, dated Dec. 20, 2016.

* cited by examiner

NEGATIVE TYPE COLORED PHOTOSENSITIVE RESIN COMPOSITION, CURED FILM, ELEMENT, AND DISPLAY DEVICE

TECHNICAL FIELD

The present invention relates to a negative type colored photosensitive resin composition, a cured film, an element, and a display device.

BACKGROUND ART

Organic EL display devices are now attracting attention as components of next generation flat panel displays. Able to perform image display with a wide view angle and a high-speed response and capable of being made thinner and lighter, the organic EL display device, which is a self-luminous type display device utilizing electroluminescence from an organic compound, has become a major focus of research and development in recent years.

The organic EL light emitting element operates on a voltage applied between a first electrode and a second electrode that are disposed opposite to each other or an electric current flowing therebetween. At this time, the electric field tends to concentrate on an edge portion of the electrode that is smaller in radius of curvature and accordingly, undesirable phenomena such as dielectric breakdown and leak current are likely to occur at such an edge portion.

To suppress these phenomena, there is a known technique that is intended to cover the edge portion of the first electrode with an insulating layer. This technique serves to alleviate the electric field concentration that can occur at the edge portion of the electrode. Furthermore, the insulating layer can be produced in such a manner that its thickness in the exposed boundary portion on the first electrode gradually increases from the boundary to form a forward tapered cross-section. This allows an organic light-emitting layer and a second electrode to be deposited smoothly after the formation of the insulating layer and serves to suppress the electric field concentration at the edge portion of the electrode.

A positive type photosensitive resin composition is commonly used as material for the insulation layer. Generally, the effective intensity of radiation into a coating film during exposure gradually decreases from the coating film surface to the bottom portion. Therefore, a positive type photosensitive resin composition can form a forward tapered shape more easily than negative type or non-photosensitive type ones because the exposed portion is dissolved and removed. Among others, positive type photosensitive resin compositions containing polyimide- or polybenzoxazole-based resin have been preferred because the resin is high in heat resistance and little gas generation occurs from cured film, making it possible to produce an organic EL display device with high reliability (see, for example, Patent document 1).

In addition, for the purpose of producing organic electroluminescent devices with increased contrast, attempts have been made to develop an insulating layer with light shielding ability, and a positive type colored photosensitive resin composition containing a light-shielding colorant has been proposed (see, for example, Patent Document 2). To impart light shielding ability necessary for enhancing the contrast, it is necessary to add a considerable amount of a coloring agent to the composition, but the radiation used for exposure is absorbed by the coloring agent and the photoreaction necessary for the pattern formation hardly occurs near the bottom of the film, resulting in a large reduction in sensitivity.

In negative type colored photosensitive resin compositions, which are generally used for the black matrix or the like of a liquid crystal display device, on the other hand, radicals generated by irradiation undergo chain reaction to insolubilize the exposed portions and accordingly, pattern formation can be achieved with relatively high sensitivity compared with positive type ones even when using a composition containing a coloring agent. When using a negative type material, however, the degree of curing reaction tends to be insufficient at the bottom of the film compared to the surface, and the insulating layer is likely to have a backward tapered shape. This induces disconnection of the second electrode formed on the insulating layer, easily leading to defective light emission.

In view of these points, negative type colored photosensitive resin compositions that contain an acrylic resin or a cardo resin and can form a forward tapered shape have been proposed (see, for example, Patent documents 3 and 4).

PRIOR ART DOCUMENTS

Patent Documents

[Patent document 1]
U.S. Unexamined Patent Application Publication No. 2002/162998
[Patent document 2]
U.S. Unexamined Patent Application Publication No. 2013/189623
[Patent document 3]
International Publication 2008/032675
[Patent document 4]
Japanese Unexamined Patent Publication (Kokai) No. 2010-204363

SUMMARY OF THE INVENTION

Problems to be Solved by the Invention

It is not always possible, however, for acrylic resin or cardo resin to work successfully to achieve sufficient heat resistance, and gas generation from cured film will be likely to cause degradation of organic luminescence material, possibly leading to a decrease in light emission luminance or shrinkage of pixels. Thus, they cannot serve practically as material for the insulation layer of organic EL display devices. Here, the term "shrinkage of pixels" means the phenomenon of a decrease in light emission luminance or lighting failure at the edges of pixels.

Accordingly, an object of the present invention is to provide a negative type colored photosensitive resin composition that is high in heat resistance and able to serve for producing a cured film having a forward tapered shape.

Means of Solving the Problems

The present invention relates to a negative type colored photosensitive resin composition including an alkali-soluble resin (A), a photo initiator (B), a photo polymerizable compound (C), and a coloring agent (D), the alkali-soluble resin (A) containing a polyimide precursor, polybenzoxazole precursor, and/or a copolymer thereof (A-1), each resin (A-1) having a trifluoromethyl group in the backbone chain.

Advantageous Effect of the Invention

The negative type colored photosensitive resin composition according to the present invention is high in heat resistance and able to serve for producing a cured film having a forward tapered shape.

DESCRIPTION OF PREFERRED EMBODIMENTS

An embodiment of the present invention is described in detail below.

The negative type colored photosensitive resin composition according to the present invention includes an alkali-soluble resin (A), a photo initiator (B), a photo polymerizable compound (C), and a coloring agent (D), the alkali-soluble resin (A) containing a polyimide precursor, polybenzoxazole precursor, and/or a copolymer thereof (A-1), each resin (A-1) having a trifluoromethyl group in the backbone chain. Herein, at least one resin selected from the group consisting of polyimide precursors, polybenzoxazole precursors, and copolymers thereof is occasionally referred to as resin (A-1).

The negative type colored photosensitive resin composition according to the present invention contains an alkali-soluble resin (A). For the present invention, alkali-solubility test is performed by dissolving a resin sample in γ-butyrolactone to prepare a solution, spreading it over a silicon wafer, prebaking it at 120° C. for 4 minutes to form a prebaked film with a film thickness of 10 μm±0.5 μm, immersing the prebaked film in a 2.38 mass % aqueous solution of tetramethyl ammonium hydroxide at 23±1° C. for 1 minute, rinsing it with pure water, and determining the dissolution rate from the decrease in film thickness, and the resin is judged to be alkali-soluble if the rate is 50 nm/min or more.

Figure 1:
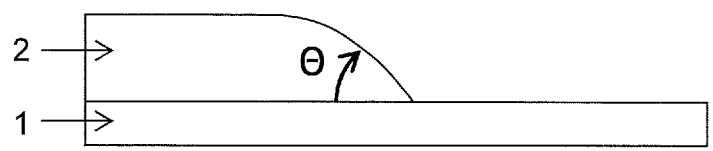
FIG. 1 illustrates a cross section of a typical boundary portion of an insulating layer.

The negative type colored photosensitive resin composition according to the present invention includes an alkali-soluble resin (A) that contains at least one resin (A-1) selected from the group consisting of polyimide precursors, polybenzoxazole precursors, and copolymers thereof, the resin (A-1) having a trifluoromethyl group in the backbone chain. By containing at least one resin (A-1) selected from the group consisting of polyimide precursors, polybenzoxazole precursors, and copolymers thereof, the composition can serve to produce a cured film with high heat resistance. By having a trifluoromethyl group in the backbone chain of the resin (A-1), the composition can serve to produce a cured film having a forward tapered shape. Here, the taper angle means the angle θ in FIG. 1, which illustrates a cross section of a structure composed of a substrate 1 and a cured film, i.e. an insulation layer 2, stacked thereon, and the term "forward tapered shape" indicates that the taper angle θ of the insulation layer 2 is less than 90°. The preference of a cured film having a cross section of a forward tapered shape is described below focusing on an organic EL display device as an example. In general, an organic EL display device has an insulation layer with a film thickness of about 1 to 10 μm formed on a first electrode. If this insulation layer has a cross section of a forward tapered shape, an organic thin film layer and a second electrode, if required, can be formed smoothly in the boundary portion after the formation of the insulation layer, allowing a light emitting device having stable characteristic to be produced owing to reduced film thickness irregularities attributed to steps. To depress electric field concentration in the edge portion of an electrode, the taper angle θ is preferably 60° or less, more preferably 50° or less, and still more preferably 40° or less, whereas it is preferably 5° or more and more preferably 10° or more to allow high density arrangement of organic EL display devices.

The reason for the fact that the existence of a trifluoromethyl group in the backbone chain of the resin (A-1) makes it possible to produce a film having a forward tapered shape is inferred as follows. If having a trifluoromethyl group in the backbone chain, the resin (A-1) will be high in optical transparency for light in the g-, h-, and i-line wavelength range, which is generally used for light exposure. Accordingly, even when a coloring agent is contained, radiation generated from light exposure will be able to reach the bottom of the film easily, allowing a rectangular pattern to result after development while preventing the cross section to become backward-tapered. A film having a backward tapered shape after development will maintain the backward tapered shape after heat-curing, but if a pattern having a rectangular cross-sectional shape is obtained after development, a heat-cured film having a forward tapered shape is likely to be formed as a result of flowing of the film caused by film shrinkage due to desolvation during heat-curing. When heat-cured, a polyimide precursor or a polybenzoxazole precursor undergoes dewatering cyclization to form an imide ring or a benzoxazole ring. This dewatering cyclization reaction causes a large film shrinkage, and accordingly a flow of the film results from the dewatering cyclization reaction, suggesting that a pattern with a small taper angle is more likely to form compared with cyclized polyimide resin.

It is preferable for the resin (A-1) to have an acidic group in the resin's structural unit and/or at the backbone chain end to develop alkali solubility. Examples of the acidic group include phenolic hydroxyl groups, sulfonic acid groups, thiol groups, and carboxy groups.

It is preferable for the resin (A-1) to contain a structure as represented by the undermentioned general formula (1) as primary component.

[Chemical compound 1]

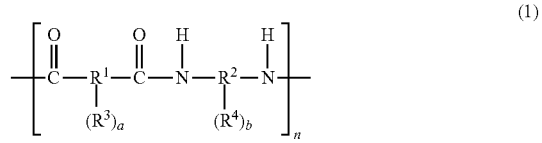

(1)

(In general formula (1), $R^1$ and $R^2$ independently denote a divalent to octavalent organic groups. $R^3$ and $R^4$ each denote a phenolic hydroxyl group, sulfonic acid group, thiol group, or $COOR^5$, which may be contained singly or different ones of which coexist. $R^5$ denotes a hydrogen atom or a monovalent hydrocarbon group having 1 to 20 carbon atoms. Here, a and b each represent an integer of 0 to 6, where a+b>0. Here, n is an integer in the range of 5 to 10,000. Note that at least one of the groups represented by $R^1$-$(R^3)_a$ or those by $R^2$-$(R^4)_b$ contains a trifluoromethyl group.)

Here, the term "primary" means that the n structural units in general formula (1) account for 50 mol % or more of the structural units in the resin (A-1). All that is required is that the n structural units in general formula (1) be the primary component, and other structural units, that is, such structural units as cyclized imide structures and benzoxazole structures, may be contained in the range of less than 50 mol %.

In the above general formula (1), $R^1$-$(R^3)_a$ denotes the residue of an acid component. $R^1$ is a divalent to octavalent organic group, preferably an organic group having 5 to 40 carbon atoms and containing an aromatic ring or a cyclic aliphatic group from the viewpoint of heat resistance of the resin. There are no specific limitations on the acid component, and examples include dicarboxylic acids, tricarboxylic acids, and tetracarboxylic acids as listed below.

Examples include dicarboxylic acids such as terephthalic acid, isophthalic acid, diphenyl ether dicarboxylic acid, bis(carboxyphenyl) hexafluoropropane, biphenyl dicarboxylic acid, benzophenone dicarboxylic acid, triphenyl dicarboxylic acid, and 5-[2,2,2-trifluoro-1-hydroxy-1-(trifluoromethyl)ethyl]-1,3-benzene dicarboxylic acid; tricarboxylic acids such as trimellitic acid, trimesic acid, diphenyl ether tricarboxylic acid, and biphenyl tricarboxylic acid; and tetracarboxylic acids including aromatic tetracarboxylic acids such as pyromellitic acid, 3,3',4,4'-biphenyl tetracarboxylic acid, 2,3,3',4'-biphenyl tetracarboxylic acid, 2,2',3,3'-biphenyl tetracarboxylic acid, 3,3',4,4'-benzophenone tetracarboxylic acid, 2,2',3,3'-benzophenone tetracarboxylic acid, 1,1-bis(3,4-dicarboxyphenyl) ethane, 1,1-bis(2,3-dicarboxyphenyl) ethane, bis(3,4-dicarboxyphenyl) methane, bis(2,3-dicarboxyphenyl) methane, bis(3,4-dicarboxyphenyl) ether, 1,2,5,6-naphthalene tetracarboxylic acid, 2,3,6,7-naphthalene tetracarboxylic acid, 2,3,5,6-pyridine tetracarboxylic acid, 3,4,9,10-perylene tetracarboxylic acid, and 4,4'-(hexafluoroisopropylidene) diphthalic acid, and others having a structure as shown below, and aliphatic tetracarboxylic acids such as butane tetracarboxylic acid and 1,2,3,4-cyclopentane tetracarboxylic acid.

1 to 4 of the hydrogen atoms in the dicarboxylic acids, tricarboxylic acids, and tetracarboxylic acids listed above be substituted by the $R^3$ group in general formula (1) or hydroxyl group, preferably hydroxyl group.

For the present invention, the acid component is preferably a compound containing a trifluoromethyl group and particularly preferred examples of the group denoted as $R^1$-$(R^3)_a$ include structures represented by general formula (4) given blow.

[Chemical compound 3]

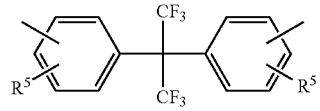

(4)

(In general formula (4), $R^5$ denotes a hydrogen atom or $COOR^6$, where $R^6$ denotes a hydrogen atom or a monovalent hydrocarbon group containing 1 to 20 carbon atoms.)

In 100 mol % of the residue of the acid component containing a group represented by $R^1$-$(R^3)_a$, the residue of the acid component having a structure as represented by general formula (4) preferably accounts for 20 mol % to 100 mol %. A content of 20 mol % or more serves to produce a cured film having a shape with a smaller taper angle, leading to a higher sensitivity. It is more preferably 30 mol % or more. The upper limit, on the other hand, is 100 mol %, and a content of 90 mol % or less is more preferable from the viewpoint of the adhesion with the substrate.

Specific examples of an acid component having a structure as represented by general formula (4) as residue include 4,4'-(hexafluoroisopropylidene) diphthalic acid, 4,4'-(hexafluoroisopropylidene) diphthalic anhydride, and 2,2-bis(4-carboxyphenyl) hexafluoropropane.

Two or more of these acid components may be used in combination. An acid component may be used in its original form or in the form of an anhydride or an active ester.

In the above general formula (1), $R^2$-$(R^4)_b$ denotes the residue of a diamine. $R^2$ is a divalent to octavalent organic

[Chemical compound 2]

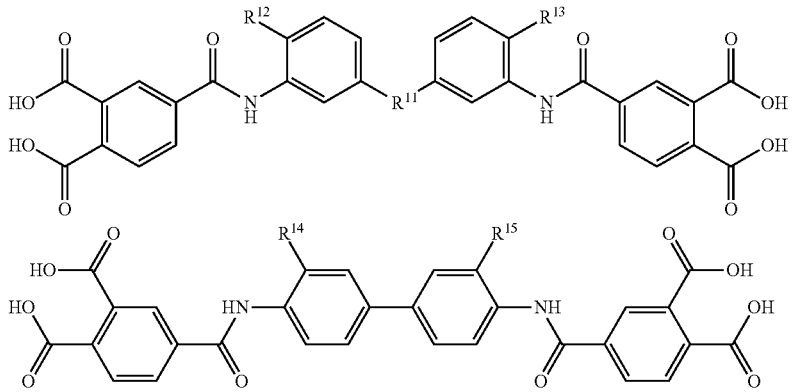

($R^{11}$ denotes an oxygen atom, $C(CF_3)_2$, or $C(CH_3)_2$. $R^{12}$, $R^{13}$, $R^{14}$ and $R^{15}$ each denote a hydrogen atom or a hydroxyl group.

Here, the one or two carboxyl groups in the tricarboxylic acids or tetracarboxylic acids correspond to the $R^3$ group in general formula (1). It is more preferable, furthermore, that group, preferably an organic group having 5 to 40 carbon atoms and containing an aromatic ring or a cyclic aliphatic group from the viewpoint of heat resistance of the resin. There are no specific limitations on the diamine component, but examples include the compounds listed below.

Specific examples of the diamine include 3,4'-diaminodiphenyl ether, 4,4'-diaminodiphenyl ether, 3,4'-diaminodiphenyl methane, 4,4'-diaminodiphenyl methane, 1,4-bis(4-aminophenoxy) benzene, benzidine, m-phenylene diamine, p-phenylene diamine, 1,5-naphthalene diamine, 2,6-naphthalene diamine, bis(4-aminophenoxy) biphenyl, bis{4-(4-aminophenoxy) phenyl} ether, 1,4-bis(4-aminophenoxy) benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl) fluorene, 2,2-bis(3-aminophenyl) hexafluoropropane, 2,2-bis(4-aminophenyl) hexafluoropropane, 2,2-bis(3-amino-4-methyl phenyl) hexafluoropropane, 2,2-bis[4-(4-aminophenoxy) phenyl] hexafluoropropane, 2,2-bis(3-amino-4-hydroxyphenyl) hexafluoropropane, 2,2'-bis(trifluoromethyl) benzidine, 2,2'-bis(trifluoromethyl)-3,3'-dihydroxy benzidine, and 2,2'-bis(trifluoromethyl)-5,5'-dihydroxy benzidine, in which at least some of the hydrogen atoms in aromatic rings may be substituted by alkyl groups or halogen atoms; and aliphatic compounds such as cyclohexyl diamine, methylene biscyclohexyl amine, diamine compounds having an alkylene oxide group, and diamine compounds having a structure as shown below. Two or more of these may be used in combination.

[Chemical compound 4]

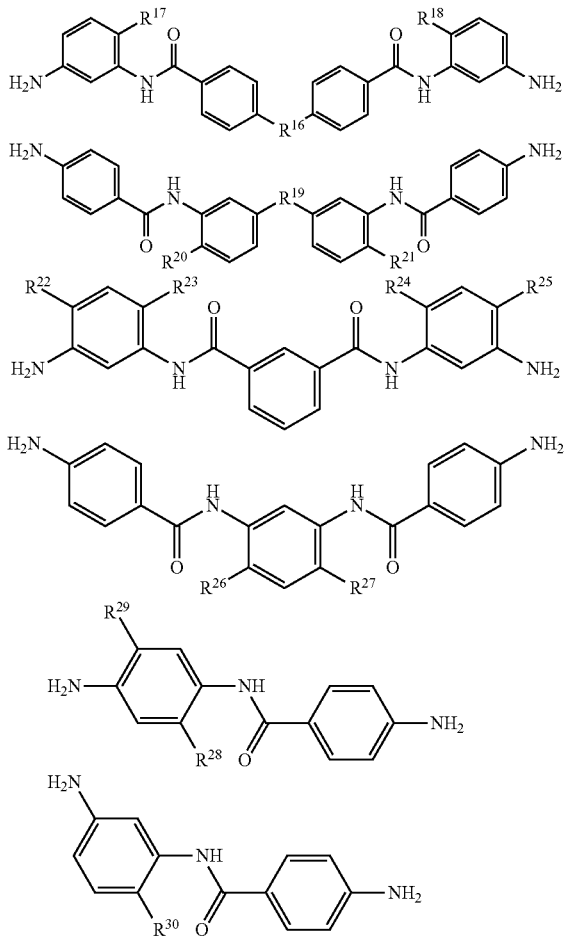

($R^{16}$ and $R^{19}$ each denote an oxygen atom, $C(CF_3)_2$, or $C(CH_3)_2$. $R^{17}$, $R^{18}$, and $R^{20}$ to $R^{30}$ each independently denote a hydrogen atom or a hydroxyl group.)

In the aromatic diamine compounds listed above, at least some of the hydrogen atoms in the aromatic rings may be substituted by alkyl groups or halogen atoms.

For the present invention, the diamine component is preferably a compound containing a trifluoromethyl group and particularly preferred examples of the groups denoted as $R^2$-$(R^4)_b$ include structures represented by general formula (2) and those represented by general formula (3) given blow.

[Chemical compound 5]

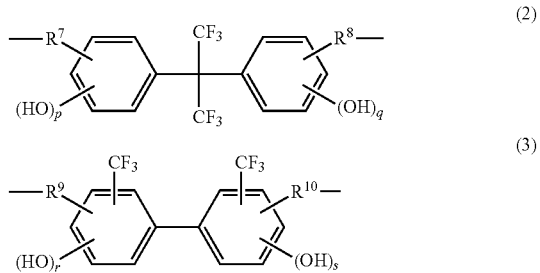

(In general formulae (2) and (3), $R^7$ to $R^{10}$ each denote a single bond or a divalent organic group containing 1 to 20 carbon atoms. And p, q, r, and s each denote 0 or 1.)

In 100 mol % of the residue of diamine containing a group represented by $R^2$-$(R^4)_b$ in general formula (1), at least one selected from the group consisting of the groups represented by general formula (2) and those represented by general formula (3) preferably accounts for 20 mol % to 100 mol %. A content of 20 mol % or more serves to produce a cured film having a shape with a smaller taper angle, leading to a higher sensitivity. It is more preferably 30 mol % or more. The upper limit, on the other hand, is 100 mol %, and a content of 90 mol % or less is more preferable from the viewpoint of the adhesion with the substrate.

Specific examples of such a diamine having a structure as represented by general formula (2) as residue include 2,2-bis(3-aminophenyl) hexafluoropropane, 2,2-bis(4-aminophenyl) hexafluoropropane, 2,2-bis(3-amino-4-methyl phenyl) hexafluoropropane, 2,2-bis[4-(4-aminophenoxy) phenyl] hexafluoropropane, 2,2-bis(3-amino-4-hydroxyphenyl) hexafluoropropane, and compounds as represented by Formula (5) or (6) given below.

[Chemical compound 6]

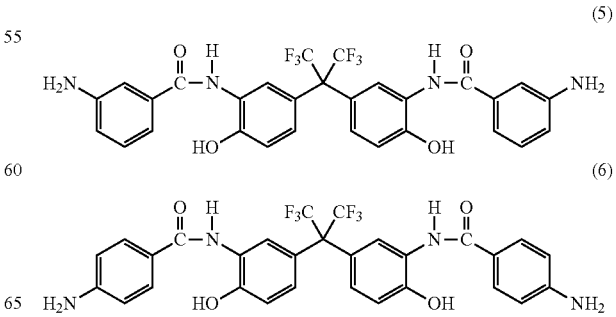

Specific examples of a diamine having a structure as represented by general formula (3) as residue include 2,2'-bis(trifluoromethyl) benzidine, 2,2'-bis(trifluoromethyl)-3,3'-dihydroxy benzidine, and 2,2'-bis(trifluoromethyl)-5,5'-dihydroxy benzidine.

Of these diamine compounds, those diamine compounds having phenolic hydroxyl groups are particularly preferable from the viewpoint of alkali developability, and particularly preferable examples include 2,2-bis(3-amino-4-hydroxyphenyl) hexafluoropropane, 2,2'-bis(trifluoromethyl)-3,3'-dihydroxy benzidine, 2,2'-bis(trifluoromethyl)-5,5'-dihydroxy benzidine, and compounds as represented by the aforementioned Equation (5).

For the present invention, the resin (A-1) preferably contains an alkylene oxide group in the backbone chain. If an alkylene oxide group is contained, a flow of the film is caused more easily in the heat-curing step and furthermore, it will be possible to obtain a cured film having a pattern shape with a small taper angle.

The available methods for introducing an alkylene oxide group to the backbone chain include, for example, copolymerization with a diamine having an alkylene oxide group, and in this case, the diamine component containing an alkylene oxide group preferably accounts for 5 mol % or more, more preferably 10 mol % or more, and preferably accounts for 40 mol % or less, more preferably 30 mol % or less, of the total diamine quantity in the resin (A-1). A content of 5 mol % or more ensures a smaller taper angle, whereas a content of 40 mol % or less ensures an adequate degree of heat resistance.

The available products of diamine having an alkylene oxide group include, but not limited to, 1,2-bis(2-aminoethoxy) ethane, Jeffamine (registered trademark, hereinafter the same) KH-511, Jeffamine ED-600, Jeffamine ED-900, Jeffamine ED-2003, Jeffamine EDR-148, Jeffamine EDR-176, Jeffamine D-200, Jeffamine D-400, Jeffamine D-2000, an Jeffamine D-4000 (all trade names, manufactured by Huntsman Corporation).

Two or more of these diamine components may be used in combination. A diamine component may be used as it is as diamine or in the form of a diisocyanate compound or trimethyl silylated diamine containing a residue represented by $R^2-(R^4)_b$.

Chain ends of such a resin may be capped with a monoamine, anhydride, acid chloride, or monocarboxylic acid having an acidic group to provide a resin having acidic groups at backbone chain ends.

Preferable examples of these monoamines include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxy pyrimidine, 2-aminophenol, 3-aminophenol, 4-aminophenol, 2-aminothiophenol, 3-aminothiophenol, and 4-aminothiophenol. Two or more of these may be used in combination.

Preferable examples of these anhydrides, acid chlorides, and monocarboxylic acids include anhydrides such as phthalic anhydride, maleic anhydride, nadic anhydride, cyclohexanedicarboxylic anhydride, and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, and 1-mercapto-5-carboxynaphthalene; those monoacid chloride compounds that can be produced from the former by converting their carboxyl group into an acid chloride group; those monoacid chloride compounds that can be produced from dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene by converting only one of their carboxyl groups into an acid chloride group; and active ester compounds that can be produced by reacting a monoacid chloride compound with N-hydroxybenzotriazole or N-hydroxy-5-norbornene-2,3-dicarboxyimide. Two or more of these may be used in combination.

The end capping agents used for the aforementioned monoamines, anhydrides, acid chlorides, or monocarboxylic acids preferably account for 2 mol % or more, more preferably 4 mol % or more, relative to the total quantity, which accounts for 100 mol %, of the acid and amine components contained in the resin. It is preferably 25 mol % or less, and more preferably 20 mol % or less.

End capping agents introduced in a resin can be detected easily by methods as described below. A resin specimen containing an end capping agent is dissolved in, for instance, an acidic solution to decompose it into amine components and acid components, that is, constituent units of the resin, and then the end capping agent can be detected easily by gas chromatography (GC) or NMR spectroscopy. In another method, detection can be carried out by subjecting a resin specimen containing an end capping agent directly to pyrolysis gas chromatograph (PGC), infrared spectroscopy, or $^{13}$C-NMR spectroscopy.

For the present invention, an alkali-soluble resin is synthesized by a generally known method. In the case of a polyimide precursor formed from a polyamic acid or polyamic ester, available production methods to achieve synthesis include, for example, a method in which a tetracarboxylic dianhydride and a diamine compound is reacted at a low temperature, a method in which a diester is produced from a tetracarboxylic dianhydride and an alcohol and then reacted with an amine in the presence of a condensation agent, and a method in which a diester is produced from a tetracarboxylic dianhydride and an alcohol and then the remaining dicarboxylic acid is treated to provide an acid chloride, which is reacted with an amine.

In the case of a polybenzoxazole precursor, production can be achieved by subjecting a bisaminophenol compound and a dicarboxylic acid to condensation reaction. More specifically, available production methods include a method in which a dehydration-condensation agent such as dicyclohexyl carbodiimide (DCC) and an acid are reacted and then a bisaminophenol compound is added and a method in which a tertiary amine such as pyridine is added to a solution of a bisaminophenol compound, followed by dropping it to a solution of a dicarboxylic acid dichloride.

To allow the colored cured film produced by curing the negative type colored photosensitive resin composition according to the present invention to have a high chemical resistance and a high solubility in an alkaline developer, it is preferable for the resin (A-1) to have a polystyrene-based weight average molecular weight of 5,000 or more, more preferably 10,000 or more, as determined by gel permeation chromatography. Furthermore, the weight average molecular weight is preferably 100,000 or less, more preferably 70,000 or less. It is also preferable for the resin (A-1) to have a polystyrene-based number average molecular weight of 2,000 or more, more preferably 4,000 or more, as determined by gel permeation chromatography. Furthermore, the number average molecular weight is preferably 50,000 or less, more preferably 40,000 or less.

The negative type colored photosensitive resin composition according to the present invention may contain, as the alkali-soluble resin (A), an alkali-soluble resin other than the resin (A-1) unless it impairs the heat resistance of the cured film.

Examples of such an alkali-soluble resin other than the resin (A-1) include polymers produced from radically polymerizable monomers, siloxane resin, and cardo resin. The combined use of one or more selected from these resins with the resin (A-1) can serve to produce a cured film having a pattern shape with a smaller taper angle. Relative to the total quantity, or 100 parts by mass, of the alkali-soluble resin (A), the resin other than the resin (A-1) preferably accounts for 5 parts by mass or more, more preferably 50 parts by mass or less. A content of 5 parts by mass or more ensures a still smaller taper angle, whereas a content of 50 parts by mass or less ensures an adequate degree of heat resistance. Two or more alkali-soluble resins other than the resin (A-1) may be used in combination.

The radically polymerizable monomer-based polymers that can be used as the alkali-soluble resin (A) for the present invention preferably have phenolic hydroxyl groups or carboxyl groups in order to impart alkali solubility.

As the radically polymerizable monomers having phenolic hydroxyl groups or carboxyl groups, generally known substances may be used and examples include o-hydroxystyrene, m-hydroxystyrene, and p-hydroxystyrene, which may be substituted by alkyl or alkoxy, and methacrylic acid and acrylic acid, which may be substituted by α-haloalkyl, alkoxy, halogen, nitro, or cyano. Of these, o-hydroxystyrene, m-hydroxystyrene, and p-hydroxystyrene, which may be substituted by alkyl or alkoxy, have been particularly preferred from the viewpoint of the sensitivity and resolution in the patterning step, proportion of the remaining film after development, heat-resistant deformability, solvent resistance, adhesion with the substrate, storage stability of the solution, etc. These may be used singly or as a mixture of two or more thereof.

As the other radically polymerizable monomers, generally known substances may be used and examples include styrene, styrene derivatives substituted by alkyl, alkoxy, halogen, haloalkyl, nitro, cyano, amide, or ester at the α-, o-, m-, or p-position, diolefins such as butadiene and isoprene, and esterification products of methacrylic acid and acrylic acid. These may be used singly or as a mixture of two or more thereof.

In particular, styrene, styrene derivatives substituted by alkyl, alkoxy, halogen, or haloalkyl at the α-, o-, m-, or p-position; butadiene and isoprene; and esterification products of methacrylic acid or acrylic acid with methyl, ethyl, n-propyl, n-butyl, glycidyl, or tricycle-$[5.2.1.0^{2,6}]$decane-8-yl are particularly preferred from the viewpoint of the sensitivity and resolution in the patterning step, proportion of the remaining film after development, heat-resistant deformability, solvent resistance, adhesion with the substrate, storage stability of the solution, etc.

When a copolymer of a radically polymerizable monomer having a phenolic hydroxyl group and another radically polymerizable monomer is used as the alkali-soluble resin, such another radically polymerizable monomer preferably accounts for 40 mass % or less, particularly preferably 30 mass % or less, relative to the total quantity of the radically polymerizable monomer having a phenolic hydroxyl group and another radically polymerizable monomer, from the viewpoint of alkali developability. Such another radically polymerizable monomer preferably accounts for 5 mass % or more.

When a copolymer of a radically polymerizable monomer having a carboxyl group and another radically polymerizable monomer is used as the alkali-soluble resin, such another radically polymerizable monomer preferably accounts for 90 mass % or less, particularly preferably 80 mass % or less, relative to the total quantity of the radically polymerizable monomer having a carboxyl group and another radically polymerizable monomer, from the viewpoint of alkali developability. Such another radically polymerizable monomer preferably accounts for 10 mass % or more.

Solvents useful for production of a polymer from radically polymerizable monomers having alkali-soluble groups include, for example, alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol diethyl ether, and diethylene glycol ethyl methyl ether; propylene glycol monoalkyl ethers such as propylene glycol monomethyl ether, propylene glycol monoethyl ether, propylene glycol monopropyl ether, and propylene glycol monobutyl ether; propylene glycol alkyl ether acetates such as propylene glycol methyl ether acetate, propylene glycol ethyl ether acetate, propylene glycol propyl ether acetate, and propylene glycol butyl ether acetate; propylene glycol alkyl ether propionates such as propylene glycol methyl ether propionate, propylene glycol ethyl ether propionate, propylene glycol propyl ether propionate, and propylene glycol butyl ether propionate; aromatic hydrocarbons such as toluene and xylene; ketones such as methyl ethyl ketone, cyclohexanone, and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methyl propionate, hydroxymethyl acetate, hydroxyethyl acetate, hydroxybutyl acetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutannoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate. It is preferable for these solvents to account for 20 parts by mass or more, more preferably 50 parts by mass or more, relative to 100 parts by mass of the radically polymerizable monomers. The solvent, on the other hand, preferably accounts for 1,000 parts by mass or less, more preferably 500 parts by mass or less.

Examples of the polymerization initiator used to produce a polymer from radically polymerizable monomers having alkali-soluble groups include azo compounds such as 2,2'-azobisisobutyronitrile, 2,2'-azobis-(2,4-dimethyl valeronitrile), and 2,2'-azobis-(4-methoxy-2,4-dimethyl valeronitrile); organic peroxides such as benzoyl peroxide, lauroyl peroxide, t-butyl peroxypivalate, and 1,1'-bis-(t-butyl peroxy) cyclohexane; and hydrogen peroxide. When adopting a peroxide as radical polymerization initiator, the peroxide may be used with a reduction agent to work as a redox type initiator.

It is preferable for the polymer produced from radically polymerizable monomers having alkali-soluble groups to have a polystyrene-based weight average molecular weight of 2,000 to 100,000 as determined by gel permeation chromatography. A weight average molecular weight of 2,000 or more ensures further improvement in pattern shape, resolution, developability, and heat resistance. It is more preferably 3,000 or more, still more preferably 5,000 or more. On the other hand, a weight average molecular weight of 100,000 or less ensures further improvement in developability and sensitivity. It is more preferably 50,000 or less, still more preferably 30,000 or less.

Examples of siloxane resins that can be used as the alkali-soluble resin (A) for the present invention include those siloxane resins that can be obtained through hydrolysis and condensation of organosilanes as represented by general formula (7) and/or organosilanes as represented by general formula (8). The use of organosilanes as represented by general formula (7) or (8) serves to provide negative type colored photosensitive resin compositions that have high sensitivity and high resolution.

For the present invention, such organosilanes as represented by general formula (7) are as defined below.

[Chemical compound 7]

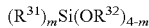  (7)

(In the above general formula (7), $R^{31}$ is a hydrogen atom, an alkyl group containing 1 to 10 carbon atoms that may have a heteroatom-containing functional group, an alkenyl group containing 2 to 10 carbon atoms, or an aryl group containing 6 to 16 carbon atoms. $R^{32}$ denotes a hydrogen atom, an alkyl group containing 1 to 6 carbon atoms, an acyl group containing 2 to 6 carbon atoms, or an aryl group containing 6 to 16 carbon atoms. Here, m is an integer in the range of 0 to 3. When m is 2 or more, the plurality of $R^{31}$ groups may be identical to or different from each other. When m is 2 or less, the plurality of $R^{32}$ groups may be identical to or different from each other.

Specific examples of organosilanes represented by the above general formula (7) include tetrafunctional silanes such as tetramethoxy silane, tetraethoxysilane, tetraacetoxy silane, and tetraphenoxy silane; trifunctional silanes such as methyl trimethoxysilane, methyl triethoxysilane, methyl tri-isopropoxysilane, methyl tri-n-butoxysilane, ethyl trimethoxysilane, ethyl triethoxysilane, ethyl triisopropoxysilane, ethyl tri-n-butoxysilane, n-propyl trimethoxysilane, n-propyl triethoxysilane, n-butyl trimethoxysilane, n-butyl triethoxysilane, n-hexyl trimethoxysilane, n-hexyl triethoxysilane, decyl trimethoxysilane, vinyl trimethoxysilane, vinyl triethoxysilane, 3-methacryloxypropyl trimethoxysilane, 3-methacryloxypropyl triethoxysilane, 3-acryloxypropyl trimethoxysilane, phenyl trimethoxysilane, phenyl triethoxysilane, p-hydroxyphenyl trimethoxysilane, 1-(p-hydroxyphenyl)ethyl trimethoxysilane, 2-(p-hydroxyphenyl)ethyl trimethoxysilane, 4-hydroxy-5-(p-hydroxyphenyl carbonyloxy)pentyl trimethoxysilane, trifluoromethyl trimethoxysilane, trifluoromethyl triethoxysilane, 3,3,3-trifluoropropyl trimethoxysilane, 3-aminopropyl trimethoxysilane, 3-aminopropyl triethoxysilane, 3-glycidoxypropyl trimethoxysilane, 3-glycidoxypropyl triethoxysilane, 2-(3,4-epoxy cyclohexyl)ethyl trimethoxysilane, 2-(3,4-epoxy cyclohexyl)ethyl triethoxysilane, [(3-ethyl-3-oxetanyl)methoxy]propyl trimethoxysilane, [(3-ethyl-3-oxetanyl) methoxy]propyl triethoxysilane, 3-mercaptopropyl trimethoxysilane, 3-trimethoxysilyl propyl succinic acid, 1-naphthyl trimethoxysilane, 1-naphthyl triethoxysilane, 1-naphthyl tri-n-propoxysilane, 2-naphthyl trimethoxysilane, 1-anthracenyl trimethoxysilane, 9-anthracenyl trimethoxysilane, 9-phenanthrenyl trimethoxysilane, 9-fluorenyl trimethoxysilane, 2-fluorenyl trimethoxysilane, 1-pyrenyl trimethoxysilane, 2-indenyl trimethoxysilane, and 5-acenaphthenyl trimethoxysilane; difunctional silanes such as dimethyl dimethoxysilane, dimethyl diethoxysilane, dimethyl diacetoxysilane, di-n-butyl dimethoxysilane, diphenyl dimethoxysilane, (3-glycidoxypropyl)methyl dimethoxysilane, (3-glycidoxypropyl)methyl diethoxysilane, di(1-naphthyl) dimethoxysilane, and di(1-naphthyl) diethoxysilane; and monofunctional silanes such as trimethyl methoxysilane, tri-n-butyl ethoxysilane, (3-glycidoxypropyl)dimethyl methoxysilane, and (3-glycidoxypropyl)dimethyl ethoxysilane. Two or more of these organosilanes may be used in combination.

For the present invention, such organosilanes as represented by general formula (8) are as defined below.

[Chemical compound 8]

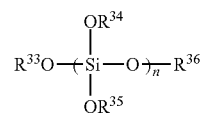  (8)

(In the above general formula (8), $R^{33}$ to $R^{36}$ each independently denote a hydrogen atom, an alkyl group containing 1 to 6 carbon atoms, an acyl group containing 2 to 6 carbon atoms, or an aryl group containing 6 to 16 carbon atoms. Here, n is an integer in the range of 2 to 8. When n is 2 or more, the plurality of $R^{34}$ and $R^{35}$ may be identical to or different from each other.)

Specific examples of organosilanes as represented by general formula (8) include Methyl Silicate 51 ($R^{33}$ to $R^{36}$: methyl group, n: 4 on average) manufactured by Fuso Chemical Co., Ltd., M Silicate 51 ($R^{33}$ to $R^{36}$: methyl group, n: 3 to 5 on average), Silicate 40 ($R^{33}$ to $R^{36}$: ethyl group, n: 4 to 6 on average), Silicate 45 ($R^{33}$ to $R^{36}$: ethyl group, n: 6 to 8 on average) manufactured by Tama Chemicals Co., Ltd., Methyl Silicate 51 ($R^{33}$ to $R^{36}$: methyl group, n: 4 on average), Methyl Silicate 53A ($R^{33}$ to $R^{36}$: methyl group, n: 7 on average), and Ethyl Silicate 40 ($R^{33}$ to $R^{36}$: ethyl group, n: 5 on average) manufactured by Colcoat Co., Ltd. Two or more of these may be used in combination.

The content of Si atoms originating from an organosilane as represented by general formula (7) or general formula (8) in a siloxane resin can be determined by identifying the structure of the original organosilane by $^1$H-NMR, $^{13}$C-NMR, $^{29}$Si-NMR, IR, TOF-MS, etc., and calculating the ratio between the integrated value of the peak attributed to the Si—C bond and that attributed to the Si—O bond in an IR spectrum.

There are no specific limitations on the weight average molecular weight (Mw) of the siloxane resin, but it is preferable for the polystyrene-based value to be 1,000 or more as determined by GPC (gel permeation chromatography) to ensure improved coat film properties. From the viewpoint of solubility in developers, on the other hand, the content is preferably 100,000 or less, more preferably 50,000 or less.

For the present invention, a siloxane resin can be synthesized through hydrolysis and partial condensation of monomers of an organosilane as represented by the above general formula (7) or (8). Here, to achieve partial condensation, part of the Si—OH bonds formed is left uncondensed in the siloxane resin obtained, instead of complete condensation of the Si—OH bonds resulting from hydrolysis. Generally known methods can be used for the hydrolysis and partial condensation. A good method is to add a solvent and water, plus a catalyst if necessary, to an organosilane mixture and stirring it for about 0.5 to 100 hours while heating at 50° C. to 150° C. During the stirring step, hydrolysis by-products (alcohols such as methanol) and condensation by-products (water) may be evaporated by distillation if necessary.

There are no specific limitations on the catalyst, but preferred ones include acid catalysts and basic catalysts. Specific examples of the acid catalysts include hydrochloric acid, nitric acid, sulfuric acid, hydrofluoric acid, phosphoric acid, acetic acid, trifluoroacetic acid, formic acid, multivalent carboxylic acids, anhydrides thereof, and ion exchange resins. Specific examples of the basic catalysts include triethyl amine, tripropyl amine, tributyl amine, tripentyl amine, trihexyl amine, triheptyl amine, trioctyl amine, diethyl amine, triethanol amine, diethanol amine, sodium hydroxide, potassium hydroxide, alkoxysilanes having amino groups, and ion exchange resins.

From the viewpoint of storage stability of the negative type colored photosensitive resin composition, the siloxane resin solution obtained after hydrolysis and partial condensation is preferably free from the above catalysts and accordingly, catalyst removal treatment may be performed as required. There are no specific limitations on the removal method, but rinsing with water and/or ion exchange resin treatment are preferable from the viewpoint of simple operation and removal performance. The rinsing with water is carried out by diluting the siloxane resin solution with an appropriate hydrophobic solvent, followed by washing with water several times and condensing the resulting organic layer using an evaporator. The ion exchange resin treatment is carried out by bringing the siloxane resin solution into contact with an appropriate ion exchange resin.

The cardo resin, which may be used appropriately as the alkali-soluble resin (A) for the present invention, is described below. The cardo resin is a resin having the cardo structure, which is a backbone structure characterized by a cyclic structure with two other cyclic structures bonded to quaternary carbon atoms in the former. A typical cardo structure is a combination of a fluorene ring and benzene rings bonded thereto.

Specific examples of such a backbone structure characterized by a cyclic structure with two other cyclic structures bonded to quaternary carbon atoms in the former include fluorene backbone, bisphenol fluorene backbone, bisaminophenyl fluorene backbone, fluorene backbone having an epoxy group, and fluorene backbone having an acrylic group.

A cardo resin is produced by polymerization of backbones having the cardo structure caused by reaction between functional groups bonded thereto. A cardo resin has a structure (cardo structure) characterized by a backbone chain and bulky side chains each bonded thereto through one atom to form a cyclic structure nearly perpendicular to the backbone chain.

Specific examples of monomers having the cardo structure include cardo structure-containing bisphenols such as bis(glycidyl oxyphenyl) fluorene type epoxy resin, 9,9-bis(4-hydroxyphenyl) fluorene, and 9,9-bis(4-hydroxy-3-methylphenyl) fluorene; 9,9-bis(cyanoalkyl) fluorenes such as 9,9-bis(cyanomethyl) fluorene; and 9,9-bis(aminoalkyl) fluorenes such as 9,9-bis(3-aminopropyl) fluorene.

The cardo resin is typically a polymer produced through polymerization of a monomer having the cardo structure, but it may be a copolymer with other copolymerizable monomers. The cardo resin used for the present invention preferably has an ethylenically unsaturated double bond group. For the cardo resin, ethylenically unsaturated double bond groups can be introduced easily into side chains branched from the backbone chain of the resin. A cardo resin having ethylenically unsaturated double bond groups is a photo-curing resin which develops a three dimensional crosslinked structure through carbon-carbon bonds when cured by UV exposure. Accordingly, a negative type colored photosensitive resin composition that contains a cardo resin having ethylenically unsaturated double bond groups in side chains will show an improved sensitivity when exposed to light.

Such a cardo resin used appropriately for the present invention preferably contains a structural unit involving a carboxylic acid such as tetracarboxylic acid, tetracarboxylic dianhydride, tricarboxylic acid, and dicarboxylic acid. A cardo resin that contains a structural unit involving a carboxylic acid can work to develop alkali-solubility.

Generally known methods such as ring opening polymerization and addition polymerization can be used for the polymerization of the monomers described above.

The negative type colored photosensitive resin composition according to the present invention contains a photo initiator (B). Examples of the photo initiator (B) include benzophenones such as benzophenone, Michler's ketone, 4,4,-bis(diethyl amino) benzophenone, and 3,3,4,4,-tetra(t-butylperoxy carbonyl) benzophenone; benzylidenes such as 3,5-bis(diethyl aminobenzylidene)-N-methyl-4-piperidone, 3,5-bis(diethyl aminobenzylidene)-N-ethyl-4-piperidone; coumarins such as 7-diethylamino-3-thenoylcoumarin, 4,6-dimethyl-3-ethyl aminocoumarin, 3,3-carbonyl bis(7-diethyl aminocoumarin), 7-diethylamino-3-(1-methylmethylbenzimidazolyl) coumarin, and 3-(2-benzothiazolyl)-7-diethyl aminocoumarin; anthraquinones such as 2-t-butyl anthraquinone, 2-ethyl anthraquinone, and 1,2-benz anthraquinone; benzoins such as benzoin methyl ether, benzoin ethyl ether, and benzoin isopropyl ether; mercapto products such as ethylene glycol di(3-mercaptopropionate), 2-mercaptobenz thiazole, 2-mercaptobenzoxazole, and 2-mercaptobenzimidazole; glycines such as N-phenyl glycine, N-methyl-N-phenyl glycine, N-ethyl-N-(p-chlorophenyl) glycine, and N-(4-cyanophenyl) glycine; oxime esters such as 1-phenyl-1,2-butanedione-2-(o-methoxycarbonyl) oxime, 1-phenyl-1,2-propanedione-2-(o-methoxycarbonyl) oxime, 1-phenyl-1,2-propanedione-2-(o-ethoxycarbonyl) oxime, 1-phenyl-1,2-propanedione-2-(o-benzoyl) oxime, bis(α-isonitrosopropiophenone oxime) isophthalate, 1,2-octane-dion-1-[4-(phenylthio)phenyl]-2-(o-benzoyl oxime)], IRGACURE (registered trademark, hereinafter the same) OXE01, IRGACURE OXE02 (both trade names, manufactured by BASF), N-1818, N-1919, and NCI-831 (all trade names, manufactured by Adeka Corporation; and α-aminoalkylphenons such as 2-benzyl-2-dimethylamino-1-(4-morpholinophenyl)-butane-1-2-methyl-1-[4-(methyl thio)phenyl]-2-morpholinopropane-1-one; and 2,2'-bis(o-chlorophenyl)-4,4',5,5'-tetraphenyl biimidazole. Of these, the oxime esters listed above are preferable because they serve for high-sensitivity pattern processing. Two or more of these may be used in combination as the photo initiator (B).

Relative to 100 parts by mass of the alkali-soluble resin (A), the photo initiator (B) preferably accounts for 0.5 part by mass or more, more preferably 1 part by mass or more, and still more preferably 2 parts by mass or more, whereas it is preferably 50 parts by mass or less, more preferably 30 parts by mass or less, and still more preferably 20 parts by mass or less. The film loss in the exposed region during development can be reduced if the content of the photo initiator (B) is 0.5 part by mass or more, whereas the heat resistance of the cured film can be improved if it is 50 parts by mass or less. In addition, a sensitizing agent may also be contained in the negative type colored photosensitive resin composition.

The negative type colored photosensitive resin composition according to the present invention contains a photo polymerizable compound (C). The photo polymerizable compound (C) has an unsaturated bond in its molecule. Examples of the unsaturated bond include unsaturated double bonds in vinyl groups, allyl groups, acryloyl groups, methacryloyl groups, etc., and unsaturated triple bonds in propargyl groups, etc. Of these, acryloyl groups and methacryloyl groups are preferable from the viewpoint of polymerizability. Preferred examples of the photo polymerizable compound (C) include polyfunctional monomers containing acryloyl groups or methacryloyl groups.

Examples of the polyfunctional monomers containing acryloyl groups or methacryloyl groups preferred for the photo polymerizable compound (C) include bisphenol A diglycidyl ether (meth)acrylate, poly(meth)acrylate carbamate, modified bisphenol A epoxy (meth)acrylate, adipic acid 1,6-hexanediol (meth)acrylic acid ester, phthalic anhydride propylene oxide (meth)acrylic acid ester, trimellitic acid diethylene glycol (meth)acrylic acid ester, rosin-modified epoxy di(meth)acrylate, alkyd-modified (meth)acrylate, fluorene diacrylate based oligomer, tripropylene glycol di(meth)acrylate, 1,6-hexanediol di(meth)acrylate, bisphenol A diglycidyl ether di(meth)acrylate, trimethylolpropane tri(meth)acrylate, pentaerythritol tri(meth)acrylate, triacrylic formal, pentaerythritol tetra(meth)acrylate and acid-modified derivatives thereof, di pentaerythritol hexa(meth) acrylate and acid-modified derivatives thereof, di pentaerythritol penta(meth)acrylate and acid-modified derivatives thereof, 2,2-bis[4-(3-acryloxy-2-hydroxypropoxy) phenyl] propane, bis[4-(3-acryloxy-2-hydroxypropoxy) phenyl] methane, bis[4-(3-acryloxy-2-hydroxypropoxy) phenyl] sulfone, bis[4-(3-acryloxy-2-hydroxypropoxy) phenyl] ether, 4,4'-bis[4-(3-acryloxy-2-hydroxypropoxy) phenyl] cyclohexane, 9,9-bis[4-(3-acryloxy-2-hydroxypropoxy) phenyl] fluorene, 9,9-bis[3-methyl-4-(3-acryloxy-2-hydroxypropoxy) phenyl] fluorene, 9,9-bis[3-chloro-4-(3-acryloxy-2-hydroxypropoxy) phenyl] fluorene, bisphenoxyethanol fluorene diacrylate, bisphenoxyethanol fluorene di(meth)acryllate, biscresol fluorene diacrylate, and biscresol fluorene di(meth)acryllate.

Appropriately selected oligomers and monofunctional monomers may be combined with these polyfunctional monomers to provide a negative type colored photosensitive resin composition with well-adjusted characteristics include sensitivity and processability. To ensure improved sensitivity, in particular, it is preferable for the photo polymerizable compound (C) preferably to contain 3 or more functional groups, and it is more preferable for the photo polymerizable compound (C) to contain 5 or more functional groups. It is still more preferable to use a dipentaerythritol hexa(meth) acrylate, dipentaerythritol penta(meth)acrylate, or an acid-modified derivative thereof. To ensure improved developability and processability, it is preferable to use an unsaturated group-containing alkali-soluble monomer produced by reacting an epoxy compound having two glycidyl ether groups with a methacrylic acid and reacting the resulting reactant with a polybasic carboxylic acid or an anhydride thereof. To control the pattern shape in the development step, furthermore, the combined use of a (meth) acrylate containing a plurality of aromatic rings and a highly water repellent fluorene ring in its molecule is preferable.

Relative to 100 parts by mass of the alkali-soluble resin (A), the photo polymerizable compound (C) preferably accounts for 10 parts by mass or more, more preferably 20 parts by mass or more, and still more preferably 30 parts by mass or more, whereas it is preferably 300 parts by mass or less, more preferably 200 parts by mass or less, and still more preferably 150 parts by mass or less. The film loss in the exposed region during development can be reduced if the content of the photo polymerizable compound (C) is 10 parts by mass or more, whereas the heat resistance of the cured film can be improved if it is 150 parts by mass or less.

The negative type colored photosensitive resin composition according to the present invention contains a coloring agent (D). The coloring agent (D) is an organic pigment, inorganic pigment, or dye that is generally used in the field of electronic information device materials. It is preferable for the coloring agent (D) to be an organic pigment and/or inorganic pigment.

Examples of the organic pigment include diketopyrrolopyrrole based pigments; azo-, disazo-, polyazo-, and other azo pigments; phthalocyanine based pigments such as copper phthalocyanine, halogenated copper phthalocyanine, and metal-free phthalocyanine; anthraquinone based pigments such as aminoanthraquinone, diaminodianthraquinone, anthrapyrimidine, flavanthrone, anthanthrone, indanthrone, pyranthrone, and violanthrone; and others such as quinacridone based pigments, dioxazine based pigments, perinone based pigments, perylene based pigments, thioindigo based pigments, isoindoline based pigments, isoindolinone based pigments, quinophtharone based pigments, threne based pigments, benzofuranone based, and metal complex based pigments.

Examples of the inorganic pigment include titanium oxide, Chinese white, zinc sulfide, lead white, calcium carbonate, precipitated barium sulfate, white carbon, alumina white, kaolin clay, talc, bentonite, black ferric oxide, cadmium red, colcothar, molybdenum red, molybdate orange, chrome vermilion, chrome yellow, cadmium yellow, yellow ferric oxide, titanium yellow, chrome oxide, viridian, titanium cobalt green, cobalt green, cobalt chrome green, Victoria green, ultramarine blue, Prussian blue, cobalt blue, cerulean blue, cobalt silica blue, cobalt zinc silica blue, manganese violet, and cobalt violet.

Useful dyes include, for example, azo dye, anthraquinone dye, fused polycyclic aromatic carbonyl dye, indigoid dye, carbonium dye, phthalocyanine dye, methine, and polymethine dye Useful red pigments include, for example, Pigment Red 9, 48, 97, 122, 123, 144, 149, 166, 168, 177, 179, 180, 192, 209, 215, 216, 217, 220, 223, 224, 226, 227, 228, 240, and 254 (each number indicates a color index (hereinafter referred to as CI number)).

Useful orange pigments include, for example, Pigment Orange 13, 36, 38, 43, 51, 55, 59, 61, 64, 65, and 71 (each number indicates a CI number).

Useful yellow pigments include, for example, Pigment Yellow 12, 13, 17, 20, 24, 83, 86, 93, 95, 109, 110, 117, 125, 129, 137, 138, 139, 147, 148, 150, 153, 154, 166, 168, and 185 (each number indicates a CI number).

Useful violet pigments include, for example, Pigment Violet 19, 23, 29, 30, 32, 37, 40, and 50 (each number indicates a CI number).

Useful blue pigments include, for example, Pigment Blue 15, 15: 3, 15: 4, 15: 6, 22, 60, and 64 (each number indicates a CI number).

Useful green pigments include, for example, Pigment Green 7, 10, 36, and 58 (each number indicates a CI number).

Useful black pigments include, for example, black organic pigments and black inorganic pigments. Useful black organic pigments include, for example, carbon black, benzofuranone based black pigments (see International Publication WO 2010/081624), perylene based black pigments, aniline based black pigments, and anthraquinone based black pigments. Of these, benzofuranone based black pigments and perylene based black pigments are preferable because they serve to produce negative type photosensitive resin compositions with high sensitivity. This is because benzofuranone based black pigments and perylene based black pigments are low in transmittance and high in light shielding ability in the visible light, whereas they are relatively high in transmittance in the ultraviolet region, accordingly ensuring efficient chemical reaction when they are exposure to light. Benzofuranone based black pigments and perylene based black pigments may be used in combination. Useful black inorganic pigments include, for example, fine particles, oxides, composite oxides, sulfides, nitrides, and acid nitrides of metals such as titanium, copper, iron, manganese, cobalt, chrome, nickel, zinc, calcium, and silver, as well as graphite, of which carbon black and titanium nitride compounds are preferable because they have high light shielding ability.

Useful white pigments include, for example, titanium dioxide, barium carbonate, zirconium oxide, calcium carbonate, barium sulfate, alumina white, and silicon dioxide.

Useful dyes include, for example, Direct Red 2, 4, 9, 23, 26, 28, 31, 39, 62, 63, 72, 75, 76, 79, 80, 81, 83, 84, 89, 92, 95, 111, 173, 184, 207, 211, 212, 214, 218, 221, 223, 224, 225, 226, 227, 232, 233, 240, 241, 242, 243, and 247; Acid Red 35, 42, 51, 52, 57, 62, 80, 82, 111, 114, 118, 119, 127, 128, 131, 143, 145, 151, 154, 157, 158, 211, 249, 254, 257, 261, 263, 266, 289, 299, 301, 305, 319, 336, 337, 361, 396, and 397; Reactive Red 3, 13, 17, 19, 21, 22, 23, 24, 29, 35, 37, 40, 41, 43, 45, 49, and 55; Basic Red 12, 13, 14, 15, 18, 22, 23, 24, 25, 27, 29, 35, 36, 38, 39, 45, and 46; Direct Violet 7, 9, 47, 48, 51, 66, 90, 93, 94, 95, 98, 100, and 101; Acid Violet 5, 9, 11, 34, 43, 47, 48, 51, 75, 90, 103, and 126; Reactive Violet 1, 3, 4, 5, 6, 7, 8, 9, 16, 17, 22, 23, 24, 26, 27, 33, and 34; Basic Violet 1, 2, 3, 7, 10, 15, 16, 20, 21, 25, 27, 28, 35, 37, 39, 40, and 48; Direct Yellow 8, 9, 11, 12, 27, 28, 29, 33, 35, 39, 41, 44, 50, 53, 58, 59, 68, 87, 93, 95, 96, 98, 100, 106, 108, 109, 110, 130, 142, 144, 161, and 163; Acid Yellow 17, 19, 23, 25, 39, 40, 42, 44, 49, 50, 61, 64, 76, 79, 110, 127, 135, 143, 151, 159, 169, 174, 190, 195, 196, 197, 199, 218, 219, 222, and 227; Reactive Yellow 2, 3, 13, 14, 15, 17, 18, 23, 24, 25, 26, 27, 29, 35, 37, 41, and 42; Basic Yellow 1, 2, 4, 11, 13, 14, 15, 19, 21, 23, 24, 25, 28, 29, 32, 36, 39, and 40; Acid Green 16, Acid Blue 9, 45, 80, 83, 90, and 185, Basic Orange 21 and or 23 (each number indicates a CI number), Sumilan, Lanyl (registered trademark) series (both manufactured by Sumitomo Chemical Co., Ltd.), Orasol (registered trademark), Oracet (registered trademark), Filamid (registered trademark), Irgasperse (registered trademark), Zapon, Neozapon, Neptune, Acidolseries (all manufactured by BASF), Kayaset (registered trademark), Kayakalan (registered trademark) series (both manufactured by Nippon Kayaku Co., Ltd.), Valifast (registered trademark) Colors series (Orient Chemical Industries Co., Ltd.), Savinyl, Sandoplast, Polysynthren (registered trademark), Lanasyn (registered trademark) series (all manufactured by Clariant Japan K.K.), Aizen (registered trademark), Spilon (registered trademark) series (both manufactured by Hodogaya Chemical Co., Ltd.), functional pigments (manufactured by Yamada Chemical Co., Ltd.), Plast Color, and Oil Color series (both manufactured by Arimoto Chemical Co., Ltd.).

To provide an organic EL display device with improved contrast, the use of a black coloring agent is preferred because visible light can be shielded over the entire wavelength range and it is recommended to adopt at least one or more selected from the group consisting of organic pigments, inorganic pigments, and dyes that will work as a black coloring agent in the resulting cured film. To this end, it is recommended to adopt black organic pigments and black inorganic pigments as described above or adopt a mixture of two or more organic pigments and dyes that can work as a pseudoblack agent. Such a pseudoblack agent can be prepared by mixing two or more selected from the group consisting of the aforementioned red, orange, yellow, violet, blue, and green organic pigments and dyes. Here, it should be noted that the negative type colored photosensitive resin composition according to the present invention should not necessarily be black, and it is permitted to use a coloring agent that changes in color during the heat curing step to provide a black cured film.

In particular, from the viewpoint of ensuring high heat resistance, it is preferable to use a coloring agent that contains an organic pigment and/or inorganic pigment and will have a black color in the intended cured film. In particular, from the viewpoint of ensuring high insulation ability, it is preferable to use a coloring agent that contains an organic pigment and/or dye and will have a black color in the intended cured film. Thus, from the viewpoint of ensuring both high insulation ability and high heat resistance, it is preferable to use a coloring agent that contains an organic pigment and will have a black color in the intended cured film.

Relative to 100 parts by mass of the alkali-soluble resin (A), the coloring agent (D) preferably accounts for 10 parts by mass or more, more preferably 20 parts by mass or more, and still more preferably 30 parts by mass or more, whereas it is preferably 300 parts by mass or less, more preferably 200 parts by mass or less, and still more preferably 150 parts by mass or less. When the content is 10 parts by mass or more, the coloring agent (D) will show a coloring performance necessary for the intended cured film, whereas when the content is 300 parts by mass or less, it will have high storage stability.

In the negative type colored photosensitive resin composition according to the present invention, the alkali-soluble resin (A) and the coloring agent (D) preferably account for 2 mass % or more, more preferably 5 mass % or more, to ensure improved dispersion stability and productivity. Their contents are preferably 60 mass % or less, and more preferably 30 mass % or less.

When using a pigment as coloring agent, it is preferable for the negative type colored photosensitive resin composition according to the present invention to contain a dispersing agent (E). The existence of the dispersing agent (E) allows coloring agents to be dispersed uniformly and stably in the resin composition. There are no specific limitations on the dispersing agent (E), it is preferably a polymer dispersing agent. Examples of the polymer dispersing agent include polyester based polymer dispersing agents, acrylic based polymer dispersing agent, polyurethane based polymer dispersing agents, polyallyl amine based polymer dispersing agents and carbodiimide based dispersing agents. More specifically, a polymer dispersing agent is a polymer compound containing a backbone chain of a polyamino, polyether, polyester, polyurethane, polyacrylate, etc., type structure and also containing a side chain or a backbone chain end having an amine, carboxylic acid, phosphoric acid, amine salt, carboxylate, phosphate, etc., type polar group. The polar group will be adsorbed to the pigment to ensure stable dispersion of the pigment owing to the steric hindrance of the backbone chain polymer.

Substances serving as the dispersing agent (E) are divided into the following categories: (polymer) dispersing agents each having only an amine number, (polymer) dispersing agents each having only an acid number, (polymer) dispersing agents each having both an amine number and an acid number, and (polymer) dispersing agents each having neither an amine number nor an acid number. Of these, (polymer) dispersing agents each having both an amine number and an acid number and (polymer) dispersing agents each having only an amine number are preferable, of which polymer dispersing agents each having only an amine number are more preferable.

Specific example of the polymer dispersing agents each having only an amine number include DISPERBYK (registered trademark) 102, 160, 161, 162, 2163, 164, 2164, 166, 167, 168, 2000, 2050, 2150, 2155, 9075, and 9077, BYK-LP N6919, BYK-LP N21116, BYK-LP N21234 (all manufactured by BYK-Chemie GmbH), EFKA (registered trademark) 4015, 4020, 4046, 4047, 4050, 4055, 4060, 4080, 4300, 4330, 4340, 4400, 4401, 4402, 4403, and 4800 (all manufactured by BAS), Ajisper (registered trademark) PB711 (manufactured by Ajinomoto Fine-Techno Co., Inc.), and SOLSPERSE (registered trademark) 13240, 13940, 20000, 71000, and 76500 (all manufactured by The Lubrizol Corporation).

Of the polymer dispersing agents each having only an amine number, polymer dispersing agents each having, as a pigment adsorbing group, a tertiary amino group or those having a basic functional group with a nitrogen-containing heterocycle, etc., such as pyridine, pyrimidine, pyrazine, and isocyanurate, are preferable because they ensure fine pigment dispersion and allow the negative type colored photosensitive resin composition to form a cured film having a small surface roughness to provide a smooth film surface. Such polymer dispersing agents each having a tertiary amino group or a basic functional group with a nitrogen-containing heterocycle include, for example, DISPERBYK (registered trademark) 164 and 167, BYK-LP N6919, BYK-LP N21116, and SOLSPERSE (registered trademark) 20000.

Such polymer dispersing agents each having both an amine number and an acid number include, for example, DISPERBYK (registered trademark) 142, 145, 2001, 2010, 2020, 2025, and 9076, Anti-Terra (registered trademark) -205 (all manufactured by BYK-Chemie GmbH), Ajisper (registered trademark) PB821, PB880, and PB881 (all manufactured by Ajinomoto Fine-Techno Co., Inc.), and SOLSPERSE (registered trademark) 9000, 11200, 13650, 24000, 24000SC, 24000GR, 32000, 32500, 32550, 326000, 33000, 34750, 35100, 35200, 37500, 39000, and 56000 (all manufactured by The Lubrizol Corporation).

Relative to the coloring agent, the polymer dispersing agents preferably account for 1 mass % or more, more preferably 3 mass % or more, to ensure improved dispersion stability while maintaining heat resistance. It is also preferable for them to account for 100 mass % or less, more preferably 50 mass % or less.

It is preferable for the negative type colored photosensitive resin composition according to the present invention to contain an organic solvent. Examples of the organic solvent include such compounds as ethers, acetates, esters, ketones, aromatic hydrocarbons, amides, and alcohols.

More specifically, such compounds include, for example, ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, dipropylene glycol dimethyl ether, dipropylene glycol methyl-n-butyl ether, tripropylene glycol monomethyl ether, tripropylene glycol monoethyl ether, diethylene glycol dimethyl ether, diethylene glycol methylethyl ether, diethylene glycol diethyl ether, and tetrahydrofuran; acetates such as butyl acetate, ethylene glycol monomethyl ether acetate, ethylene glycol monoethyl ether acetate, propylene glycol monomethyl ether acetate, 3-methoxybutyl acetate, ethylene glycol monobutyl ether acetate, diethylene glycol monomethyl ether acetate, diethylene glycol monoethyl ether acetate, diethylene glycol monobutyl ether acetate, cyclohexanol acetate, propylene glycol diacetate, propylene glycol monomethyl ether acetate, propylene glycol monoethyl ether acetate (hereinafter PGMEA), dipropylene glycol methyl ether acetate, 3-methoxy-3-methyl-1-butyl acetate, 1, 4-butanediol diacetate, 1, 3-butylene glycol diacetate, and 1, 6-hexanediol diacetate; ketones such as methyl ethyl ketone, cyclohexanone, 2-heptanone, and 3-heptanone; alkyl lactates such as methyl 2-hydroxypropionate and ethyl 2-hydroxypropionate; other esters such as ethyl 2-hydroxy-2-methyl propionate, methyl 3-methoxypropionate, ethyl 3-methoxypropionate, methyl 3-ethoxypropionate, ethyl 3-ethoxypropioate, ethoxyethyl acetate, hydroxyethyl acetate, methyl 2-hydroxy-3-methyl butanoate, 3-methoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, acetomethyl acetate, acetoethyl acetate, and ethyl 2-oxobutanate; aromatic hydrocarbons such as toluene and xylene; amides such as N-methyl pyrolidone, N,N-dimethyl formamide, and N,N-dimethyl acetamide; and alcohols such as butyl alcohol, isobutyl alcohol, pentanol, 4-methyl-2-pentanol, 3-methyl-2-butanol, 3-methyl-3-methoxybutanol, and diacetone alcohol.

When a pigment is used as the coloring agent, it is preferable for an acetate type compound to be used as the organic solvent in order to ensure stable dispersion of the pigment. Relative to the total quantity of the organic solvents contained in the negative type colored photosensitive resin composition according to the present invention, it is preferable for the acetate type compounds to account for 50 mass % or more, more preferably 70 mass % or more. It is also preferable for them to account for 100 mass % or less, more preferably 90 mass % or less.

As large substrates are coming into wider use, die coating machines are now used commonly to coat them and accordingly, it is preferred to use a mixed organic solvent of two or more compounds to ensure required volatility and drying performance in the coating step. Relative to the total quantity of the organic solvents, the compounds with a boiling point of 120° C. to 180° C. preferably account for 30 mass % or more to allow the negative type colored photosensitive resin composition according to the present invention to form a photosensitive resin film having a uniform film thickness and also having high surface smoothness and adhesiveness. It is also preferable for them to account for 95 mass % or less.

Relative to the total solid quantity, which accounts for 100 parts by mass, in the negative type colored photosensitive resin composition according to the present invention, it is preferable for the organic solvent to account for 50 parts by mass or more, more preferably 100 parts by mass or more. It is also preferable for them to account for 2,000 parts by mass or less, more preferably 1,000 parts by mass or less.

It is preferable for the negative type colored photosensitive resin composition according to the present invention to contain a chain transfer agent (F). The existence of the chain transfer agent (F) serves to form a heat-cured film having a cross-sectional shape with a still smaller taper angle. When the negative type colored photosensitive resin composition according to the present invention is exposed to light, radicals are generated from the photo initiator (B) and cause polymerization of the photo polymerizable compound (C) through chain reaction to cure the exposed region. After receiving radicals from growing polymer chains, the chain transfer agent (F) works to stop the extension of the polymer, but the chain transfer agent receiving radicals can also work to attach the monomer to start its polymerization again. Therefore, the existence of the chain transfer agent (F) allows the polymer formed through the chain reaction of the photo polymerizable compound (C) to have a relatively lower molecular weight and accordingly ensures an increased film flowability in the heat-curing step, leading to the formation of a heat-cured film having a cross-sectional shape with a still smaller taper angle.

Examples of the chain transfer agent (F) include polyfunctional thiols. Such polyfunctional thiols should at least have two or more thiol (SH) groups.

Examples of such polyfunctional thiol compounds include ethylene glycol bisthiopropionate (EGTP), butanediol bisthiopropionate (BDTP), trimethylolpropane tris-thiopropionate (TMTP), pentaerythritol tetrakis thiopropionate (PETP), tetraethylene glycol bis-(3-mercaptopropionate), dipentaerythritol hexakis (3-mercaptopropionate), pentaerythritol tetrakis (thioglycolate), Karenz (registered trademark, hereinafter the same) MT BD1, Karenz MTPE1, and Karenz MT NR1 (all manufactured by Showa Denko K.K.).

The content of the chain transfer agent (F) is preferably 0.1 part by mass or more, more preferably 0.5 part by mass or more, relative to 100 parts by mass of the alkali-soluble resin (A). It is also preferable for it to account for 20 parts by mass or less, more preferably 10 parts by mass or less. If the chain transfer agent (F) accounts for 0.1 part by mass or more, it will be possible to form a heat-cured film having a cross-sectional shape with a smaller taper angle, whereas if it accounts for 20 parts by mass or less, high heat resistance can be maintained.

The negative type colored photosensitive resin composition according to the present invention may contain a polymerization terminator. A polymerization terminator is a compound that can work to terminate radical polymerization by capturing radicals generated in the light exposure step or radicals located at the growing polymer chain end of polymer chains formed by the radical polymerization in the light exposure step and holding the radicals in a stable state.

The inclusion of a polymerization terminator in an appropriate quantity serves to reduce the quantity of residue left after the development step to ensure improved resolution after development. This is considered to be because the excess radicals generated in the exposure step or the excess radicals located at growing chain ends of high-molecular weight polymers are captured by the polymerization terminator to arrest excessive progress of the radical polymerization.

As the polymerization terminator, a phenolic polymerization terminator is preferable. Examples of the phenolic polymerization terminator include 4-methoxyphenol, 1,4-hydroquinone, 1,4-benzoquinone, 2-t-butyl-4-methoxyphenol, 3-t-butyl-4-methoxyphenol, 4-t-butyl catechol, 2,6-di-t-butyl-4-methyl phenol, 2,5-di-t-butyl-1,4-hydroquinone, 2,5-di-t-amyl-1,4-hydroquinone, and IRGANOX (registered trademark) 1010, 1035, 1076, 1098, 1135, 1330, 1726, 1425, 1520, 245, 259, 3114, 565, and 295 (all manufactured by BASF).

The content of the polymerization terminator is preferably 0.01 part by mass or more, more preferably 0.03 part by mass or more, relative to 100 parts by mass of the alkali-soluble resin (A). It is preferably 10 parts by mass or less, and more preferably 5 parts by mass or less. A polymerization terminator content of 0.01 part by mass or more ensures improved resolution after the development step and a content of 10 parts by mass or less ensures high sensitivity maintained in the exposure step.

The negative type colored photosensitive resin composition according to the present invention may contain a thermal crosslinking agent. A thermal crosslinking agent is a compound that contains, in one molecule, at least two heat-reactive functional groups such as alkoxymethyl groups, methylol groups, epoxy groups, and oxetanyl groups. It is preferable for a thermal crosslinking agent to be contained because it can work to crosslink the alkali-soluble resin (A) and other added components to produce a cured film having increased chemical resistance and hardness.

Examples of such compounds having at least two of alkoxy methyl groups and methylol groups include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (trade names, all manufactured by Honshu Chemical Industry Co., Ltd.); and NIKALAC (registered trademark, hereinafter the same) MX-290, NIKALAC MX-280, NIKALAC MX-270, NIKALAC MX-279, NIKALAC MW-100LM, and NIKALAC MX-750LM (trade names, all manufactured by Sanwa Chemical Co., Ltd.).

Preferable examples of compounds having at least two epoxy groups include Epolite 40E, Epolite 100E, Epolite 200E, Epolite 400E, Epolite 70P, Epolite 200P, Epolite 400P, Epolite 1500NP, Epolite 80MF, Epolite 4000, Epolite 3002 (all manufactured by Kyoeisha Chemical Co., Ltd.), Denacol (registered trademark, hereinafter the same) EX-212L, Denacol EX-214L, Denacol EX-216L, Denacol EX-850L, Denacol EX-321L (all manufactured by Nagase ChemteX Corporation), GAN, GOT (both manufactured by Nippon Kayaku Co., Ltd.), Epikote 828, Epikote 1002, Epikote 1750, Epikote 1007, YX8100-BH30, E1256, E4250, E4275 (all manufactured by Japan Epoxy Resin Co., Ltd.), Epicron EXA-9583, HP4032, N695, HP7200 (all manufactured by DIC Corporation), VG3101 (manufactured by Mitsui Chemicals, Inc.), Tepic (registered trademark, hereinafter the same) S, Tepic G, Tepic P (all manufactured by Nissan Chemical Industries, Ltd.), NC6000 (manufactured by Nippon Kayaku Co., Ltd.), and Epotohto YH-434L (manufactured by Tohto Kasei Co., Ltd.).

Preferable examples of compounds having at least two oxetanyl groups include Eternacoll (registered trademark, hereinafter the same) EHO, Eternacoll OXBP, Eternacoll OXTP, Eternacoll OXMA (all manufactured by Ube Industries, Ltd.), and oxethane-modiofied phenol novolac.

Two or more of these thermal crosslinking agents may be used in combination.

The content of these thermal crosslinking agents is preferably 1 part by mass or more, more preferably 3 parts by mass or more, relative to 100 parts by mass of the alkali-soluble resin (A). It is preferably 50 parts by mass or less, and more preferably 30 parts by mass or less. A content of the thermal crosslinking agent of 1 part by mass or more serves to provide a cured film having increased chemical resistance and hardness, whereas a content of 50 parts by mass or less allows the negative type colored photosensitive resin composition to have high storage stability.

The negative type colored photosensitive resin composition according to the present invention may contain an adhesion improving agent. Examples of the adhesion improving agent include silane coupling agents such as vinyl trimethoxysilane, vinyl triethoxysilane, epoxy cyclohexylethyl trimethoxysilane, 3-glycidoxypropyl trimethoxysilane, 3-glycidoxypropyl triethoxysilane, p-styryl trimethoxysilane, 3-aminopropyl trimethoxysilane, 3-aminopropyl triethoxysilane, and N-phenyl-3-aminopropyl trimethoxysilane, and others such as titanium chelating agent, aluminum chelating agent, and those compound resulting from a reaction between an aromatic amine compound and an alkoxy-containing silicon compound. Two or more of these may be contained together. If these adhesion improving agents are contained, a photosensitive resin film in a development step, for example, can achieve stronger adhesion with a substrate material such as silicon wafer, ITO, $SiO_2$, and nitride silicon. They also serve to improve the resistance to oxygen plasma used for cleaning and to UV ozone processing. The content of the adhesion improving agents is preferably 0.1 part by mass or more, more preferably 0.3 part by mass or more, relative to 100 parts by mass of the alkali-soluble resin (A). It is preferably 10 parts by mass or less, and more preferably 5 parts by mass or less.

The negative type colored photosensitive resin composition according to the present invention may also contain a surfactant as required with the aim of improving the wettability on substrates. Appropriate commercially available compounds can be used as surfactants and specific examples include, but not limited to, silicone based surfactants such as the SH series, SD series, and ST series manufactured by Dow Corning Toray Silicone Co. Ltd., BYK series manufactured by BYK-Chemie Japan K.K., KP series manufactured by Shin-Etsu Chemical Co., and TSF series manufactured by Toshiba Silicone Co., Ltd.; fluorine based surfactants such as the Megafac (registered trademark) series manufactured by Dainippon Ink and Chemicals Inc., Fluorad series manufactured by Sumitomo 3M Limited, Surflon (registered trademark) series and AsahiGuard (registered trademark) series manufactured by Asahi Glass Co., Ltd., EF series manufactured by Shin Akita Kasei Co., Ltd., and PolyFox series manufactured by Omnova Solutions; and acrylic and/or methacrylic polymer-based surfactants such as the Polyflow series manufactured by Kyoeisha Chemical Co., Ltd., and Disparlon (registered trademark) series manufactured by Kusumoto Chemicals Ltd.

The content of the surfactant is preferably 0.001 part by mass or more, more preferably 0.002 part by mass or more, relative to 100 parts by mass of the alkali-soluble resin (A). It is preferably 1 part by mass or less, and more preferably 0.5 part by mass or less.

Described below is the production method for the negative type colored photosensitive resin composition according to the present invention. For example, a negative type colored photosensitive resin composition can be produced by dissolving the components (A) to (D), along with a dispersing agent (E), chain transfer agent (F), polymerization terminator, thermal crosslinking agent, adhesion improving agent, and surfactant as necessary, in an organic solvent. This dissolution can be carried out by stirring, heating, etc. When heating is performed, an appropriate heating temperature is adopted in a range, commonly from room temperature to 80° C., where the performance of the resin composition is not impaired. There are no specific limitations on the order of dissolving these components, and for instance, the compound with the lowest solubility may be dissolved first followed by others in the order of solubility. Otherwise, the dissolution of those components that are likely to form bubbles when dissolved by stirring, such as surfactants and some adhesion improving agents, may be postponed to the other components so that the dissolution of the latter will not be hindered by bubble formation.

When a pigment is used as the coloring agent (D), a good method is to use a disperser to disperse a pigment-containing coloring agent in a solution of the alkali-soluble resin (A).

Examples of the disperser include ball mill, bead mill, sand grinder, triple roll mill, and high speed impact mill, of which the use of a bead mill is preferable to achieve high dispersion efficiency and fine dispersion. Examples of bead mills include CoBall Mill, basket mill, pin mill, and DYNO mill. Examples of the beads for bead mills include titania bead, zirconia bead, and zircon beads. These bead mills preferably have a bead diameter of 0.01 mm or more, more preferably 0.03 mm or more. It is preferably 5.0 mm or less, more preferably 1.0 mm or less. If the coloring agent is small in primary particle diameter and also small in the particle diameter of secondary particles formed through aggregation of primary particles, it is preferable to use fine beads of 0.03 mm or more, more preferably 0.10 mm or less. In this case, it is desirable to adopt a bead mill equipped with a centrifugal separation type separator that can separate the fine beads from the dispersion liquid.

To disperse a coloring agent containing bulky particles of a submicronic size, on the other hand, the use of beads of 0.10 mm or more is preferable because large crushing power can be obtained.

The resulting resin composition is preferably filtrated through a filter to remove dust and particles. Filters with a pore size of, for instance, 0.5 µm, 0.2 µm, 0.1 µm, or 0.05 µm are available, though there are no specific limitations on the size. The filter to be used for filtration may be of such a material as polypropylene (PP), polyethylene (PE), nylon (NY), and polytetrafluoroethylene (PTFE), of which polyethylene and nylon are preferable. The negative type colored photosensitive resin composition contains pigments and accordingly, it is preferable to use a filter having a pore size larger than the particle diameter of the pigments.

Described in detail below is the method for producing a cured film from the negative type colored photosensitive resin composition according to the present invention. The cured film production method includes a step for spreading the negative type colored photosensitive resin composition over a substrate to form a photosensitive resin film, a step for drying the resulting photosensitive resin film, a step for exposing the dried photosensitive resin film to light, a step for developing the light-exposed photosensitive resin film, and a step for heat-treating the developed photosensitive resin film.

In the step for forming a photosensitive resin film, the negative type colored photosensitive resin composition according to the present invention is spread by the spin coating technique, slit coating technique, dip coating technique, spray coating technique, printing technique, etc., to produce a photosensitive resin film from the photosensitive resin composition. Before the coating step, the base to be coated with the photosensitive resin composition may be pre-treated with an adhesion improving agent as described above. For example, an adhesion improving agent may be dissolved in a solvent such as isopropanol, ethanol, methanol, water, tetrahydrofuran, propylene glycol monomethyl ether acetate, propylene glycol monomethyl ether, ethyl lactate, and diethyl adipate to prepare a 0.5 to 20 mass % solution, which is then used to treat the surface of the base. The treatment of the surface of the base may be carried out by such a technique as spin coating, slit die coating, bar coating, dip coating, spray coating, and steam treatment. In the step for drying the photosensitive resin film, the coating of the photosensitive resin film is first subjected to vacuum drying if necessary and then heat-treated in the range of 50° C. to 180° C. for 1 minute to several hours using a hot plate, oven, infrared ray, etc., to provide a photosensitive resin film.

Described below is the method for forming a pattern from the resulting photosensitive resin film, that is, the step for exposing the dried photosensitive resin film to light. An actinic ray is applied to the photosensitive resin film through a photomask having an intended pattern. Actinic rays available for light exposure include ultraviolet ray, visible light, electron beam, and X-ray, of which the i-line (365 nm), h-line (405 nm), and g-line (436 nm) of mercury lamps are preferred for the invention.

In the step for developing the photosensitive resin film, the light-exposed photosensitive resin film is developed with a developer to remove the non-exposed regions. Preferable developers include an aqueous solution of alkaline compounds such as tetramethyl ammonium hydroxide, diethanol amine, diethyl aminoethanol, sodium hydroxide, potassium hydroxide, sodium carbonate, potassium carbonate, triethyl amine, diethyl amine, methyl amine, dimethyl amine, dimethylaminoethyl acetate, dimethylaminoethanol, dimethylaminoethyl methacrylate, cyclohexyl amine, ethylene diamine, and hexamethylene diamine. In some cases, polar solvents such as N-methyl-2-pyrolidone, N,N-dimethyl formamide, N,N-dimethyl acetamide, dimethyl sulfoxide, γ-butyrolactone, and dimethyl acrylamide; alcohols such as methanol, ethanol, and isopropanol; esters such as ethyl lactate and propylene glycol monomethyl ether acetate; and ketones such as cyclopentanone, cyclohexanone, isobutyl ketone, and methyl isobutyl ketone may be added singly or in combination to such an aqueous alkali solution. The available development techniques include spraying, paddling, immersion, and ultrasonic vibration.

The pattern formed by development is preferably rinsed with distilled water. Here again, the distilled water used for rinsing may contain an alcohol such as ethanol and isopropyl alcohol, and an ester such as ethyl lactate and propylene glycol monomethyl ether acetate.

Then, a step for heat-treating the developed photosensitive resin film is carried out. This heat treatment serves to remove the residual solvent and components with low heat resistance, thus ensuring improvement in heat resistance and chemical resistance. The negative type colored photosensitive resin composition according to the present invention contains a polyimide precursor, polybenzoxazole precursor, and/or a copolymer thereof and accordingly, imide rings or oxazole rings can be formed by the heat treatment, leading to improved heat resistance and chemical resistance. If a thermal crosslinking agent is contained, heat treatment works to promote the thermal crosslinking reaction and accordingly, the heat resistance and chemical resistance will be improved. This heat treatment is performed for 5 minutes to 5 hours by stepwise heating at selected temperatures or continuous heating over a certain selected temperature range. For example, heat treatment may be performed at 150° C. and 250° C. for 30 minutes each. Or, heating may be performed for 2 hours while linearly increasing the temperature from room temperature to 300° C. For the present invention, the heat treatment conditions preferably specify a temperature of 150° C. or more, more preferably 200° C. or more. The heat treatment conditions also preferably specify a temperature of 400° C. or less, more preferably 350° C. or less.

The cured film formed from the negative type colored photosensitive resin composition according to the present invention preferably has an optical density (OD value) of 0.3 or more, more preferably 0.5 or more, still more preferably 1.0 or more, and preferably 3.0 or less, more preferably 2.5 or less, still more preferably 2.0 or less, at a thickness of 1.0 µm. An optical density of 0.3 or more will contribute to production of a display device having an improved contrast, whereas an optical density of 3.0 or less ensures reduced residues around pattern openings.

The cured film formed by curing the negative type colored photosensitive resin composition according to the present invention can be used suitably as the planarization layer and insulation layer in a display device that includes a TFT-carrying substrate, planarization layer on a drive circuit, an insulation layer on a first electrode, and display element, stacked in this order. Thus, the planarization layer and/or insulation layer work as cured film-containing components.

Examples of display devices having such a structure include liquid crystal display device and organic EL display device. Among others, it is used particularly suitably in organic EL display devices that require planarization layers and insulation layers having high heat resistance and small outgassing. The cured film formed by curing the negative type colored photosensitive resin composition according to the present invention may be used only in either the planarization layer or the insulation layer, or in both of them. An active matrix type display device includes a substrate of glass etc. having a TFT thereon, wiring located on one side of the TFT and connected to the TFT, a planarization layer located thereon so as to cover the irregularities, and a display element on top of the planarization layer. The display element and wiring are connected to each other through a contact hole provided in the planarization layer.

Figure 2:
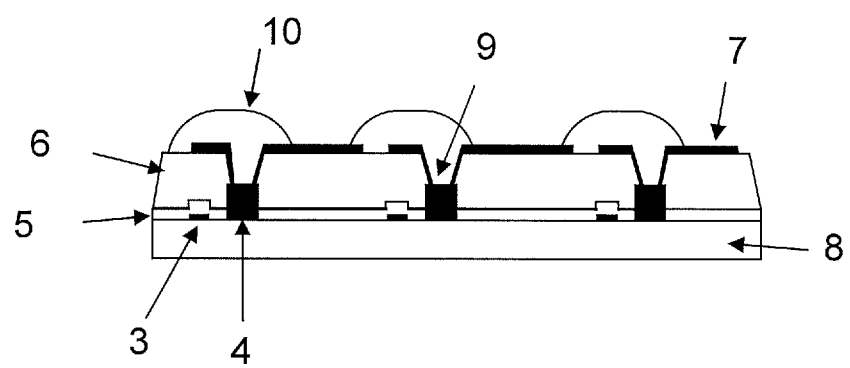
FIG. 2 illustrates a cross section of a typical TFT substrate having a planarization layer and an insulation layer according to an embodiment.

FIG. 2 gives a cross section of a TFT substrate having a planarization layer and an insulation layer formed thereon. On a substrate 8, bottom gate type or top gate type TFTs 3 are located along a line, and a TFT insulation film 5 is formed so as to cover these TFTs 3. Under this TFT insulation film 5, there exists wiring 4 that is connected to the TFTs 3. On the TFT insulation film 5, that exist contact holes 9 to expose the wiring 4 and a planarization layer 6 to embed them. The planarization layer 6 has openings to reach the contact holes 9 on the wiring 4. An ITO (transparent electrode) 7 is located on the planarization layer 6 and connected to the wiring 4 through the contact holes 9. Here, the ITO 7 works as an electrode of the display element (for example, an organic EL element). In addition, an insulation layer 10 is provided so as to cover the margin of the ITO 7. This organic EL element can work as either a top emission type one that emits luminescence from the opposite side to the substrate 8 or a bottom emission type one that emits luminescence from the substrate 8 side.

EXAMPLES

The present invention will be illustrated below in greater detail with reference to Examples, but it should be understood that the invention is not construed as being limited thereto. The evaluations of negative type colored photosensitive resin compositions described in Examples are carried out by the following methods.

(1) Average Molecular Weight Measurement

To determine the molecular weights of the alkali-soluble resin samples (a-1) to (a-10), measurements were taken by a GPC (gel permeation chromatography) apparatus (Waters 2690-996, manufactured by Nihon Waters K.K.) using N-methyl-2-pyrolidone (hereinafter referred to as NMP) as eluent and converted into the polystyrene-based number average molecular weight (Mn).

(2) Evaluation of Sensitivity

The negative type colored photosensitive resin composition sample prepared in each Example was spread over an OA-10 glass plate (manufactured by Nippon Electric Glass Co., Ltd.) by spin coating at an appropriate rotating speed and prebaked on a hot plate at 100° C. for 2 minutes to provide a film with a film thickness of 2.0 μm. Then, using a double side alignment type single side aligner (Mask Aligner PEM-6M; manufactured by Union Optical Co., Ltd.), i-line (wavelength 365 nm), h-line (wavelength 405 nm), or g-line (wavelength 436 nm) beam from an ultrahigh pressure mercury lamp was applied through a gray scale mask for sensitivity measurement to form a pattern. Subsequently, using an automatic development apparatus (AD-2000, manufactured by Takizawa Sangyo Co., Ltd.), shower development was performed for 60 seconds with a 2.38 mass % aqueous solution of tetramethyl ammonium hydroxide, followed by rinsing with pure water for 30 seconds. The pattern on the film developed by the above procedure was observed by an FDP Microscope MX61 (manufactured by Olympus Corporation) at a magnification of 20 times to determine the exposure energy required to form a 20 μm line-and-space pattern with a 1 to 1 width ratio (hereinafter referred to as optimum exposure energy), which was assumed to represent the sensitivity.

(3) Evaluation of Heat Resistance of Cured Film

The negative type colored photosensitive resin composition sample prepared in each Example was spread over an OA-10 glass plate (manufactured by Nippon Electric Glass Co., Ltd.) by spin coating at an appropriate rotating speed and prebaked on a hot plate at 100° C. for 2 minutes. Next, using a double side alignment type single side aligner (Mask Aligner PEM-6M; manufactured by Union Optical Co., Ltd.), light exposure was performed at the optimum exposure energy determined above in paragraph "(2) Evaluation of sensitivity". The, development was performed for 60 seconds with a 2.38 mass % aqueous solution of tetramethyl ammonium hydroxide, followed by rinsing with pure water. Subsequently, curing was performed in a nitrogen atmosphere in an oven at 250° C. for 60 minutes to provide a cured film with a film thickness of 1.0 μm. Using a thermogravimetric analysis apparatus (TGA-50, manufactured by Shimadzu Corporation), a 10 mg portion of the cured film was predried in a nitrogen atmosphere at 150° C. for 30 minutes and heated to 400° C. at a heating rate of 10° C./min. The weight retaining rate at 400° C. was calculated by the following equation (X).

$$\text{Weight retaining rate (\%)} = 100 \times W/W_0$$

W: weight of film after heating at 400° C.
$W_0$: weight of film after predrying In Comparative example 7, where a positive type colored photosensitive resin composition was used, a cured film prepared without performing the exposure step was subjected to the above evaluation.

(4) Evaluation of Cross-Sectional Shape of Cured Film

The developed film on a substrate prepared in paragraph (2) was cured in a nitrogen atmosphere in an oven at 250° C. for 60 minutes. Based on the resulting 20 μm pattern line on the cured film, the cross-sectional shape was examined using a scanning electron microscope (S-4800, manufactured by Hitachi, Ltd.) to determine the taper angle θ defined in FIG. 1.

(5) Evaluation of Surface Roughness of Cured Film

Using a contact type film thickness meter (DEKTAK150, manufactured by ULVAC, Inc.), the surface roughness (nm) of a cured film with a film thickness of 1.0 μm prepared by the procedure described above in paragraph (3) was measured with a stylus pressure of 5 mg.

(6) Evaluation of Optical Density (OD Value) of Cured Film

Using an optical densitometer (361T Visual, manufactured by X-Rite), the intensities of incident light to and transmitted light from a cured film with a film thickness of 1.0 μm prepared by the procedure described above in paragraph (3) were measured and the OD value, i.e., light shielding ability, was calculated by equation (Y) given below.

$$\text{OD value} = \log_{10}(I_0/I) \qquad \text{equation (Y)}$$

$I_0$: intensity of incident light
I: intensity of transmitted light (7) Luminescence Characteristics of Organic EL Display Device <Production Method for Organic EL Display Device>

FIG. 3(a) to (d) show schematic views of the substrates used. First, an ITO transparent conductive coating of 10 nm was formed by sputtering over the entire surface of a non-alkali glass substrate 11 of 38 mm×46 mm and etched to produce a first electrode 12. An auxiliary electrode 13 was formed simultaneously to produce a second electrode (FIG. 3(a)). The resulting substrate was subjected to ultrasonic cleaning for 10 minutes with Semico Clean (registered trademark) 56 (trade name, manufactured by Furuuchi Chemical Corporation) and then rinsed with ultrapure water. In each Example, an appropriate photosensitive resin composition was spread by spin coating over the entire surface of the substrate and prebaked on a hot plate at 100° C. for 2 minutes. This film was subjected to UV exposure through a photomask and developed with a 2.38 mass % aqueous solution of tetramethyl ammonium hydroxide to dissolve only the light-exposed regions, followed by rinsing with pure water. The resulting patterned film was cured in a nitrogen atmosphere in an oven at 250° C. for 60 minutes. In this way, an insulation layer 14 having openings with a width of 70 μm and a length of 260 μm aligned at intervals of 155 μm in the width direction and 465 μm in the length of direction, each opening exposing the first electrode, was formed in an limited effective area of the substrate (FIG. 3 (b)). These openings produced here will finally serve as light emitting pixels. The limited effective area of the substrate had a size of 16 mm×16 mm and the insulation layer had a thickness of about 1.0 μm.

Then, an organic EL display device was produced using a substrate having a first electrode 12, auxiliary electrode 13, and insulation layer 14 formed thereon. After carrying out nitrogen plasma treatment as pre-treatment, an organic EL layer 15 that included a light emitting layer was formed by vacuum deposition (FIG. 3 (c)). Here, the degree of vacuum used for deposition was $1 \times 10^{-3}$ Pa or less and the substrate was rotated relative to the deposition source during the deposition step. First, a compound (HT-1) was deposited to 10 nm to form a hole injection layer and compound (HT-2) was deposited to 50 nm to form a hole transport layer. Subsequently, a compound (GH-1) and a compound (GD-1) were deposited as host material and dopant material, respectively, in the light emitting layer in such a manner as to achieve a doping concentration of 10% and a thickness of 40 nm. Then, a layer of compounds (ET-1) and (LiQ) with a volume ratio of 1:1, adopted as electron transport materials, was formed thereon to a thickness of 40 nm. The structures of the compounds used in the organic EL layer are shown blow.

[Chemical compound 9]

HT-1

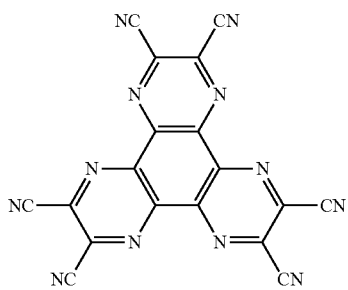

HT-2

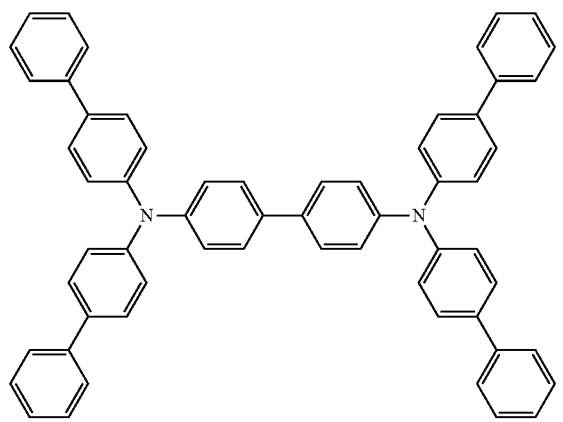

GH-1

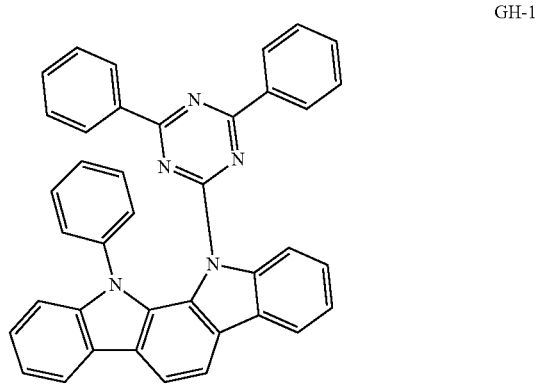

GD-1

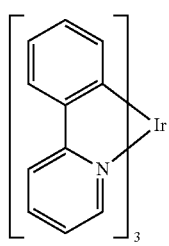

LiQ

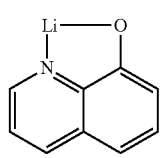

ET-1

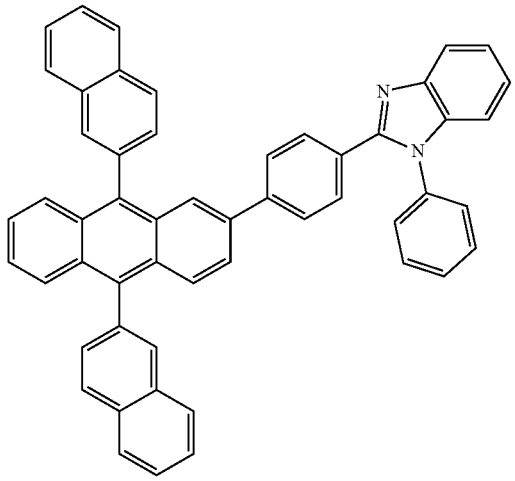

Figure 3:
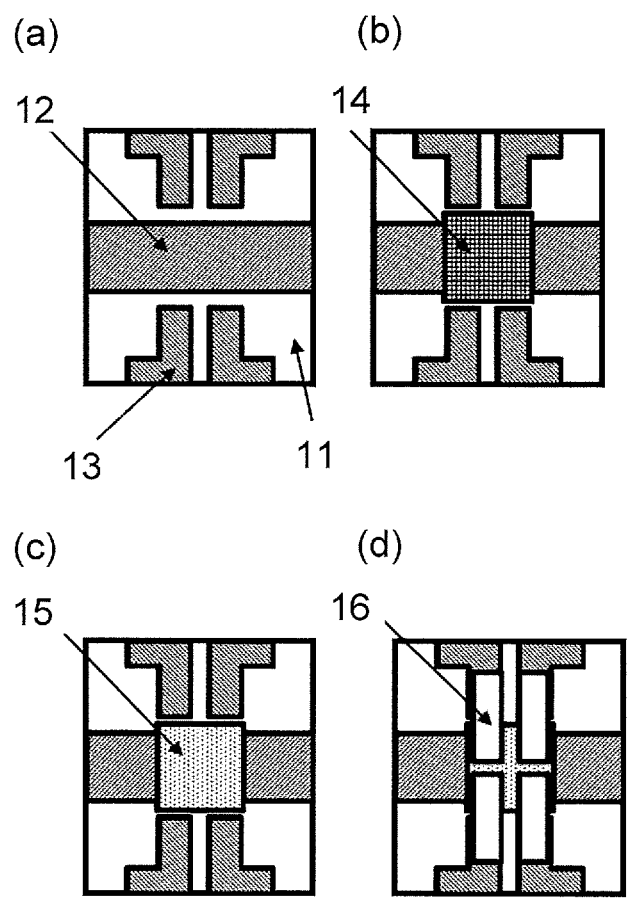
FIG. 3(*a*) to (*d*) are schematic diagrams of a substrate of an organic EL display device according to an embodiment.

Then, a compound (LiQ) was deposited to 2 nm and MgAg was deposited to 10 nm with a volume ratio of 10:1 to form a second electrode 16 (FIG. 3 (d)). Finally, in a low-humidity nitrogen atmosphere, a cap-shaped glass plate was adhered with an epoxy resin based adhesion agent to ensure sealing, thus producing four 5 mm×5 mm light emitting devices on one substrate. The film thickness referred to herein is the reading on a crystal oscillation type film thickness monitor.

<Evaluation of Luminescence Characteristics>

An organic EL display device prepared by the above procedure was caused to emit light by driving it at a direct current of 10 mA/cm² to check for non-luminescent regions or brightness irregularities. If the device was found to be good without non-luminescent regions or brightness irregularities in this initial evaluation, it was maintained at 80° C. for 500 hours for durability test and caused to emit light again by driving it at a direct current of 10 mA/cm² to check for changes in luminescence characteristics.

Synthesis Example 1: Synthesis of Hydroxyl-Containing Diamine Compound

First, 18.3 g (0.05 mole) of 2,2-bis(3-amino-4-hydroxyphenyl) hexafluoropropane (hereinafter referred to as BAHF) was dissolved in 100 mL of acetone and 17.4 g (0.3 mole) of propylene oxide, and cooled to −15° C. Then, a solution of 20.4 g (0.11 mole) of 3-nitrobenzoyl chloride dissolved in 100 mL of acetone was added dropwise. After the end of dropping, the solution was allowed to react at −15° C. for 4 hours, followed by leaving it to return to room temperature. The white solid precipitate was separated out by filtration and vacuum-dried at 50° C.

A 30 g portion of the solid material was placed in a 300 mL stainless steel autoclave and dispersed in 250 mL of methyl cellosolve, followed by adding 2 g of 5% palladium-carbon. Then, a balloon was used to introduce hydrogen to cause a reduction reaction at room temperature. After about 2 hours, the reaction was finished after checking that the balloon would be deflated no more. After the end of the reaction, the solution was filtrated to remove the palladium compound used as catalyst and concentrated in a rotary evaporator to provide a hydroxyl-containing diamine compound as represented by the formula given below.

[Chemical compound 10]

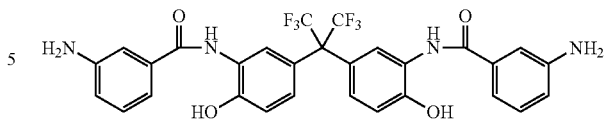

Synthesis Example 2: Synthesis of Alkali-Soluble Resin (a-1)

In a dry nitrogen flow, 62.0 g (0.20 moles) of 3,3',4,4'-diphenyl ether tetracarboxylic dianhydride (hereinafter referred to as ODPA) was dissolved in 500 g of N-methyl-2-pyrolidone (hereinafter referred to as NMP). Here, 96.7 g (0.16 moles) of the hydroxyl-containing diamine compound prepared in Synthesis Example 1 was added together with 100 g of NMP, followed by performing reaction at 20° C. for 1 hour and additional reaction at 50° C. for 2 hours. Then, 8.7 g (0.08 moles) of 3-aminophenol, used as end-capping agent, was added together with 50 g of NMP, followed by performing reaction at 50° C. for 2 hours. Subsequently, a solution prepared by diluting 47.7 g (0.40 moles) of N,N-dimethyl formamide dimethyl acetal with 100 g of NMP was added dropwise over 10 minutes. After the dropping, stirring was performed at 50° C. for 3 hours. After the stirring, the solution was cooled to room temperature and then the solution was poured into 5 L of water to provide a white precipitate. This precipitate was collected by filtration, rinsed with water 3 times, and dried in a vacuum drying machine at 80° C. for 24 hours to provide an alkali-soluble resin (a-1) containing the intended polyimide precursor. The alkali-soluble resin (a-1) had a number average molecular weight of 11,000.

Synthesis Example 3: Synthesis of Alkali-Soluble Resin (a-2)

Except for adding 58.6 g (0.16 moles) of 2,2-bis-(3-amino-4-hydroxyphenyl) hexafluoropropane (hereinafter referred to as BAHF) instead of 96.7 g (0.16 moles) of a hydroxyl-containing diamine compound, the same procedure as in Synthesis example 2 was carried out to produce an alkali-soluble resin (a-2) containing the intended polyimide precursor. The alkali-soluble resin (a-2) had a number average molecular weight of 8,700.

Synthesis Example 4: Synthesis of Alkali-Soluble Resin (a-3)

Except for adding 56.4 g (0.16 moles) of 2,2'-bis-(trifluoromethyl)-5,5'-dihydroxybenzidine instead of 96.7 g (0.16 moles) of a hydroxyl-containing diamine compound, the same procedure as in Synthesis example 2 was carried out to produce an alkali-soluble resin (a-3) containing the intended polyimide precursor. The alkali-soluble resin (a-3) had a number average molecular weight of 8,500.

Synthesis Example 5: Synthesis of Alkali-Soluble Resin (a-4)

Except for adding 49.6 g (0.16 moles) of ODPA and 17.8 g (0.04 moles) of 2,2-bis-(3,4-dicarboxyphenyl) hexafluoropropane dianhydride (hereinafter referred to as 6FDA) instead of 62.0 g (0.20 moles) of ODPA, the same procedure as in Synthesis Example 2 was carried out to produce an alkali-soluble resin (a-4) containing the intended polyimide precursor. The alkali-soluble resin (a-4) had a number average molecular weight of 11,500.

Synthesis Example 6: Synthesis of Alkali-Soluble Resin (a-5)

Except for adding 88.8 g (0.20 moles) of 6FDA instead of 62.0 g (0.20 moles) of ODPA, the same procedure as in Synthesis Example 6 was carried out to produce an alkali-soluble resin (a-5) containing the intended polyimide precursor. The alkali-soluble resin (a-5) had a number average molecular weight of 12,500.

Synthesis Example 7: Synthesis of Alkali-Soluble Resin (a-6)

Except for adding 11.7 g (0.032 moles) of BAHF and 25.6 g (0.128 moles) of 4,4'-diaminodiphenyl ether (hereinafter referred to as DAE) instead of 58.6 g (0.16 moles) of BAHF and adding 23.9 g (0.20 moles) of N, N-dimethyl formamide dimethyl acetal, the same procedure as in Synthesis Example 3 was carried out to produce an alkali-soluble resin (a-6) containing the intended polyimide precursor. The alkali-soluble resin (a-6) had a number average molecular weight of 6,500.

Synthesis Example 8: Synthesis of Alkali-Soluble Resin (a-7)

Except for adding 77.4 g (0.128 moles) of hydroxyl-containing diamine and 18.6 g (0.032 moles) of Jeffamine ED600 as alkylene oxide-containing diamine instead of 96.7 g (0.16 moles) of a hydroxyl-containing diamine compound, the same procedure as in Synthesis example 5 was carried out to produce an alkali-soluble resin (a-7) containing the intended polyimide precursor. The alkali-soluble resin (a-7) had a number average molecular weight of 10,700.

Synthesis Example 9: Synthesis of Alkali-Soluble Resin (a-8)

In a dry nitrogen air flow, 41.3 g (0.16 moles) of diphenyl ether-4,4'-dicarboxylic acid and 43.2 g (0.32 moles) of 1-hydroxy-1,2,3-benzotriazole were reacted and then 0.16 moles of the resulting dicarboxylic derivative mixture and 73.3 g (0.20 moles) of BAHF were dissolved in 570 g of NMP, following by continuing their reaction at 75° C. for 12 hours. Subsequently, a 13.1 g (0.08 moles) of 5-norbornene-2,3-dicarboxylic anhydride dissolved in 70 g of NMP was added, followed by additional stirring for 12 hours to complete the reaction. The reaction mixture was filtered and then the reaction mixture was poured in a solution of water and methanol mixed at a ratio of 3:1 (by volume) to provide a white precipitate. This precipitate was collected by filtration, rinsed with water 3 times, and dried in a vacuum drying machine at 80° C. for 24 hours to provide an alkali-soluble resin (a-8) containing the intended polybenzoxazole precursor. The alkali-soluble resin (a-8) had a number average molecular weight of 8,500.

Synthesis Example 10: Synthesis of Alkali-Soluble Resin (a-9)

Except for adding 32.0 g (0.16 moles) of DAE instead of 96.7 g (0.16 moles) of a hydroxyl-containing diamine compound and omitting the addition of N, N-dimethyl formamide dimethyl acetal, the same procedure as in Synthesis example 2 was carried out to produce an alkali-soluble resin (a-9) containing the intended polyimide precursor. The alkali-soluble resin (a-9) had a number average molecular weight of 6,000.

Synthesis Example 11: Synthesis of Alkali-Soluble Resin (a-10)

In a dry nitrogen flow, 58.6 g (0.16 moles) of BAHF and 8.7 g (0.08 moles) of 3-aminophenol, used as end-capping agent, was dissolved in 300 g of N-methyl-2-pyrolidone (NMP). To this solution, 62.0 g (0.20 mole) of ODPA was added together with 100 g of NMP, stirred at 20° C. for 1 hour, and additionally stirred at 50° C. for 4 hours. Subsequently, 15 g of xylene was added and stirred at 150° C. for 5 hours while distilling water together with xylene. After the stirring, the solution was poured in 5 L of water and a white precipitate was collected. This precipitate was collected by filtration, rinsed with water 3 times, and dried in a vacuum drying machine at 80° C. for 24 hours to provide an alkali-soluble resin (a-10) containing the intended polyimide resin. The alkali-soluble resin (a-10) had a number average molecular weight of 8,200.

Synthesis Example 12: Synthesis of Alkali-Soluble Resin (a-11)

A methyl methacrylate/methacrylic acid/styrene copolymer (mass ratio 30/40/30) was synthesized by a generally known method (specified in Example 1, Japanese Patent No. 3120476). After adding 40 parts by mass of glycidylmethacrylate to 100 parts by mass of the above copolymer, reprecipitation with purified water, filtration, and drying were performed to produce an alkali-soluble resin (a-11) containing an acrylic resin that is a polymer of radically polymerizable monomers having a weight average molecular weight (Mw) of 15,000 and an acid number of 110 (mgKOH/g).

Synthesis Example 13: Synthesis of Alkali-Soluble Resin (a-13)

In a dry nitrogen air flow, 54.48 g (0.40 moles) of methyl trimethoxysilane, 99.15 g (0.50 moles) of phenyl trimethoxysilane, 12.32 g (0.05 moles) of 2-(3,4-epoxy cyclohexyl) ethyl trimethoxysilane, 5.88 g (corresponding to 0.05 moles of Si atoms) of M Silicate 51 (manufactured by Tama Chemicals Co., Ltd.), and 155.04 g of propylene glycol monomethyl ether acetate (hereinafter referred to as PGMEA) were fed in a 500 ml three neck flask, and an aqueous phosphoric acid solution of 0.515 g (0.30 parts by mass relative to the monomers fed) of phosphoric acid dissolved in 54.45 g of water was added over 10 minutes while stirring at room temperature. Subsequently, the flask was immersed in an oil bath at 40° C., followed by stirring for 60 minutes and then heating the oil bath over 30 minutes to reach 115° C. One hour after the start of heating, the internal temperature in the solution reached 100° C. and heating was continued while stirring for additional 2 hours (the internal temperature maintained at 100° C.) to produce an alkali-soluble resin (a-13) containing a siloxane resin solution.

Synthesis Example 14: Synthesis of Photo Acid Generator

In a dry nitrogen flow, 21.22 g (0.05 mole) of TrisP-PA (trade name, manufactured by Honshu Chemical Industry Co., Ltd.) and 36.27 g (0.135 moles) of 5-naphthoquinone diazide sulfonyl acid chloride were dissolved in 450 g of 1,4-dioxane and maintained at room temperature. To this solution, 15.18 g of triethyl amine mixed with 50 g of 1,4-dioxane was added dropwise while maintaining the system below 35° C. After the dropping, it was stirred at 30° C. for 2 hours. The triethylamine salt was filtered and the filtrate was poured in water. Then, the precipitate deposited was collected by filtration. The resulting precipitate was dried in a vacuum drying machine to provide a photo acid generator as represented by the following formula.

[Chemical compound 11]

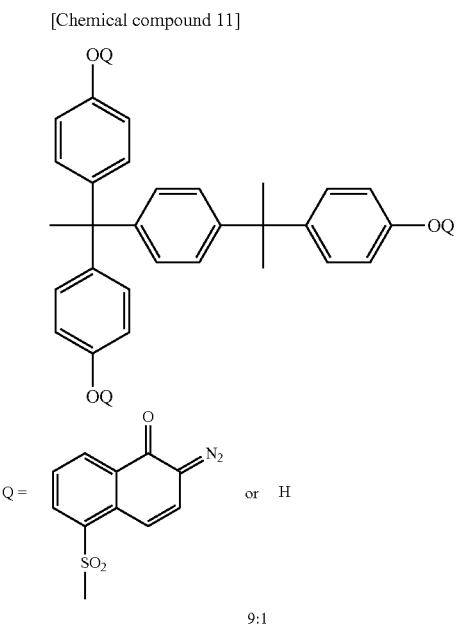

Of the compounds described in Examples and Comparative examples, those other than the resins synthesized in Synthesis examples 2 to 13 are given below.

Cardo resin (a-12) PGMEA solution of cardo resin (solid content 56.5 mass %, V259ME, manufactured by Nippon Steel Chemical Co., Ltd.)

Photo initiator (b-1) Adeka ARKLS (registered trademark) NCI-831 (manufactured by Adeka Corporation)

Photo polymerizable compound (c-1) KAYARAD (registered trademark) DPHA (dipentaerythritol hexaacrylate, manufactured by Nippon Kayaku Co., Ltd.)

Coloring agent (d-1) Irgaphor (registered trademark) Black S0100CF (benzofuranone based black organic pigment, manufactured by BASF)

Coloring agent (d-2) C. I. Pigment Red 254 (red organic pigment)

Coloring agent (d-3) C. I. Pigment Yellow 139 (yellow organic pigment)

Coloring agent (d-4) C. I. Pigment Blue 15:6 (blue organic pigment)

Coloring agent (d-5) C. I. Solvent Red 18 (red dye)

Coloring agent (d-6) C. I. Disperse Yellow 201 (yellow dye)

Coloring agent (d-7) C. I. Solvent Blue 63 (blue dye)

Coloring agent (d-8) PALIOGEN (registered trademark) BLACK S0084 (perylene based black organic pigment, manufactured by BASF)

Coloring agent (d-9) TPK-1227 (carbon black, manufactured by CABOT)

Dispersing agent (e-1) SOLSPERSE (registered trademark) 20000 (tertiary amino group-containing polyether based dispersing agent, manufactured by Lubrizol)

Dispersing agent (e-2) BYK (registered trademark) -140 (a dispersing agent containing neither tertiary amino group nor nitrogen-containing heterocyclic basic functional group, manufactured by BYK-Chemie Japan K.K.)

Chain transfer agent (f-1) Karenz MTPE1 (manufactured by Showa Denko K.K.)

Preparation Example 1

A 50.0 g portion of the alkali-soluble resin (a-1) obtained in Synthesis example 2, used as alkali-soluble (A), and 117 g of 3-methoxybutyl acetate (hereinafter referred to as MBA), used as solvent, were weighed and mixed to provide a resin solution. To this resin solution, 16.7 g of SOLSPERSE 20000, used as the dispersing agent (E), 828 g of MBA, used as solvent, and 100 g of Irgaphor Black S0100CF, used as the coloring agent (D), were weighed, mixed, and stirred for 20 minutes in a high speed disperser (Homodisper, Model 2.5, manufactured by PRIMIX Corporation) to provide a preliminary dispersion liquid. In Ultra Apex Mill (UAM-015, manufactured by Kotobuki Industry Co., Ltd.) equipped with a centrifugal separation separator filled to 75% with zirconia crushing balls with a diameter of 0.30 mm (YTZ, manufactured by Tosoh Corporation) as ceramic beads for pigment dispersion, the preliminary dispersion liquid obtained above was fed and treated for 3 hours at a rotor's circumferential speed of 7.0 m/s to provide a pigment dispersion liquid (Dsp-1) with a solid content of 15 mass %.

Preparation Examples 2 to 17

Pigment dispersion liquids Dsp-2 to Dsp-17 were prepared by the same procedure as in Preparation example 1 using the compounds listed in Table 1 in the quantities specified therein.

TABLE 1

| | Pigment dispersion liquid | Alkali-soluble resin (A) | Coloring agent (D) | Dispersing agent (E) | Solvent |
|---|---|---|---|---|---|
| Preparation example 1 | Dsp-1 | a-1 50.0 g | d-1 100 g | e-1 16.7 g | MBA 945 g |
| Preparation example 2 | Dsp-2 | a-2 50.0 g | d-1 100 g | e-1 16.7 g | MBA 945 g |
| Preparation example 3 | Dsp-3 | a-3 50.0 g | d-1 100 g | e-1 16.7 g | MBA 945 g |
| Preparation example 4 | Dsp-4 | a-4 50.0 g | d-1 100 g | e-1 16.7 g | MBA 945 g |
| Preparation example 5 | Dsp-5 | a-5 50.0 g | d-1 100 g | e-1 16.7 g | MBA 945 g |
| Preparation example 6 | Dsp-6 | a-6 50.0 g | d-1 100 g | e-1 16.7 g | MBA 945 g |
| Preparation example 7 | Dsp-7 | a-7 50.0 g | d-1 100 g | e-1 16.7 g | MBA 945 g |
| Preparation example 8 | Dsp-8 | a-8 50.0 g | d-1 100 g | e-1 16.7 g | MBA 945 g |
| Preparation example 9 | Dsp-9 | a-9 50.0 g | d-1 100 g | e-1 16.7 g | MBA 945 g |
| Preparation example 10 | Dsp-10 | a-10 50.0 g | d-1 100 g | e-1 16.7g | MBA 945 g |
| Preparation example 11 | Dsp-11 | a-11 50.0 g | d-1 100 g | e-1 16.7 g | PGMEA 945 g |
| Preparation example 12 | Dsp-12 | a-12 88.5 g | d-1 100 g | e-1 16.7 g | PGMEA 905 g |

TABLE 1-continued

| Pigment dispersion liquid | Alkali-soluble resin (A) | Coloring agent (D) | Dispersing agent (E) | Solvent |
|---|---|---|---|---|
| Preparation example 13 | Dsp-13 | a-13 95.0 g | d-1 100 g | e-1 16.7 g | PGMEA 900 g |
| Preparation example 14 | Dsp-14 | a-1 50.0 g | d-2/d-3/d-4 35 g/15 g/50 g | e-1 16.7 g | MBA 945 g |
| Preparation example 15 | Dsp-15 | a-1 50.0 g | d-8 100 g | e-1 16.7 g | MBA 945 g |
| Preparation example 16 | Dsp-16 | a-2 50.0 g | d-9 100 g | e-1 16.7 g | MBA 945 g |
| Preparation example 17 | Dsp-17 | a-1 50.0 g | d-1 100 g | e-2 16.7 g | MBA 945 g |

Example 1

Under yellow light, 3.3 g of the alkali-soluble resin (a-1) obtained in Synthesis example 2, used as the alkali-soluble resin (A), 0.60 g of (b-1), used as the photo initiator (B), and 4.0 g of (c-1), used as the photo polymerizable compound (C), were weighed and 16.3 g of MBA was added to this mixture, followed by stirring for dissolution to provide a preliminary dispersion liquid. Then, 60.0 g of the pigment dispersion liquid (Dsp-1) obtained in Preparation example 1 was weighed and the preliminarily prepared liquid obtained above was added to this, followed by stirring to provide a uniform solution. Subsequently, the resulting solution was filtrated through a filter with a pore size of 1 μm to provide a photosensitive resin composition A. The final constitution of the resulting photosensitive resin composition A is given in Table 2. This photosensitive resin composition was subjected to the evaluations (1) to (7) described above.

Examples 2 to 15 and 17 to 19, and Comparative Examples 1 to 6

Using the pigment dispersion liquids (Dsp-2 to Dsp-17), photosensitive resin compositions B to O and Q to S and photosensitive resin compositions a to f that had the final compounds listed in Table 2 in the quantities specified therein were prepared by the same procedure as in Example 1. The resulting photosensitive resin compositions were subjected to the evaluations (1) to (7) described above.

TABLE 2

| | photosensitive resin composition | pigment dispersion liquid used | alkali-soluble resin (A) | photo initiator (B) | photo polymerizable compound (C) | coloring agent (D) | dispersing agent (E) | chain transfer agent (F) | solvent | others |
|---|---|---|---|---|---|---|---|---|---|---|
| Example 1 | A | Dsp-1 | a-1 6.0 g | b-1 0.6 g | c-1 4.0 g | d-1 5.4 g | e-1 0.9 g | | MBA 67.3 g | |
| Example 2 | B | Dsp-2 | a-2 6.0 g | b-1 0.6 g | c-1 4.0 g | d-1 5.4 g | e-1 0.9 g | | MBA 67.3 g | |
| Example 3 | C | Dsp-3 | a-3 6.0 g | b-1 0.6 g | c-1 4.0 g | d-1 5.4 g | e-1 0.9 g | | MBA 67.3 g | |
| Example 4 | D | Dsp-4 | a-4 6.0 g | b-1 0.6 g | c-1 4.0 g | d-1 5.4 g | e-1 0.9 g | | MBA 67.3 g | |
| Example 5 | E | Dsp-5 | a-5 6.0 g | b-1 0.6 g | c-1 4.0 g | d-1 5.4 g | e-1 0.9 g | | MBA 67.3 g | |
| Example 6 | F | Dsp-6 | a-6 6.0 g | b-1 0.6 g | c-1 4.0 g | d-1 5.4 g | e-1 0.9 g | | MBA 67.3 g | |
| Example 7 | G | Dsp-7 | a-7 6.0 g | b-1 0.6 g | c-1 4.0 g | d-1 5.4 g | e-1 0.9 g | | MBA 67.3 g | |
| Example 8 | H | Dsp-8 | a-8 6.0 g | b-1 0.6 g | c-1 4.0 g | d-1 5.4 g | e-1 0.9 g | | MBA 67.3 g | |
| Example 9 | I | Dsp-1 Dsp-11 | a-1/a-11 4.8 g/1.2 g | b-1 0.6 g | c-1 4.0 g | d-1 5.4 g | e-1 0.9 g | | MBA/PGMEA 57.1 g/10.2 g | |
| Example 10 | J | Dsp-1 Dsp-12 | a-1/a-12 4.8 g/1.2 g | b-1 0.6 g | c-1 4.0 g | d-1 5.4 g | e-1 0.9 g | | MBA/PGMEA 57.1 g/10.2 g | |
| Example 11 | K | Dsp-1 Dsp-13 | a-1/a-13 4.8 g/1.2 g | b-1 0.6 g | c-1 4.0 g | d-1 5.4 g | e-1 0.9 g | | MBA/PGMEA 57.1 g/10.2 g | |
| Example 12 | L | Dsp-14 | a-1 6.0 g | b-1 0.6 g | c-1 4.0 g | d-2/d-3/d-4 1.9 g/0.8 g/2.7 g | e-1 0.9 g | | MBA 67.3 g | |
| Example 13 | M | Dsp-1 | a-1 6.0 g | b-1 0.6 g | c-1 4.0 g | d-1 5.4 g | e-1 0.9 g | f-1 0.3 g | MBA 67.3 g | |
| Example 14 | N | Dsp-1 | a-1 6.0 g | b-1 0.6 g | c-1 4.0 g | d-1 1.08 g | e-1 0.18 g | | MBA 67.3 g | |
| Example 15 | O | Dsp-1 | a-1 6.0 g | b-1 0.6 g | c-1 4.0 g | d-1 10.8 g | e-1 1.8 g | | MBA 67.3 g | |
| Example 16 | P | — | a-1 6.0 g | b-1 0.6 g | c-1 4.0 g | d-5/d-6/d-7 0.2 g/0.2 g/1.0 g | | | MBA 67.3 g | |
| Example 17 | Q | Dsp-15 | a-1 6.0 g | b-1 0.6 g | c-1 4.0 g | d-8 5.4 g | e-1 0.9 g | | MBA 67.3 g | |
| Example 18 | R | Dsp-16 | a-1 6.0 g | b-1 0.6 g | c-1 4.0 g | d-9 2.7 g | e-1 0.45 g | | MBA 67.3 g | |
| Example 19 | S | Dsp-17 | a-1 6.0 g | b-1 0.6 g | c-1 4.0 g | d-1 5.4 g | e-2 0.9 g | | MBA 67.3 g | |
| Comparative example 1 | a | Dsp-9 | a-9 6.0 g | b-1 0.6 g | c-1 4.0 g | d-1 5.4 g | e-1 0.9 g | | MBA 67.3 g | |
| Comparative example 2 | b | Dsp-10 | a-10 6.0 g | b-1 0.6 g | c-1 4.0 g | d-1 5.4 g | e-1 0.9 g | | MBA 67.3 g | |
| Comparative example 3 | c | Dsp-11 | a-11 6.0 g | b-1 0.6 g | c-1 4.0 g | d-1 5.4 g | e-1 0.9 g | | PGMEA 67.3g | |
| Comparative example 4 | d | Dsp-12 | a-12 6.0 g | b-1 0.6 g | c-1 4.0 g | d-1 5.4 g | e-1 0.9 g | | PGMEA 67.3 g | |

TABLE 2-continued

| | photosensitive resin composition | pigment dispersion liquid used | alkali-soluble resin (A) | photo initiator (B) | photo polymerizable compound (C) | coloring agent (D) | dispersing agent (E) | chain transfer agent (F) | solvent | others |
|---|---|---|---|---|---|---|---|---|---|---|
| Comparative example 5 | e | Dsp-9 | a-9 6.0 g | b-1 0.6 g | c-1 4.0 g | d-1 1.08 g | e-1 0.9 g | | MBA 67.3 g | |
| Comparative example 6 | f | Dsp-9 | a-9 6.0 g | b-1 0.6 g | c-1 4.0 g | d-1 10.8 g | e-1 0.9 g | | MBA 67.3 g | |
| Comparative example 7 | g | Dsp-1 | a-1 9.0 g | | | d-1 5.4 g | e-1 0.9 g | | MBA 67.3 g | photo acid generator 1.6 g |

Example 16

Under yellow light, 6.0 g of the alkali-soluble resin (a-1) obtained in Synthesis example 2, used as the alkali-soluble resin (A), 0.60 g of (b-1), used as the photo initiator (B), 4.0 g of (c-1), used as the photo polymerizable compound (C), and 0.2 g, 0.2 g, and 1.0 g of the organic dyes (d-5), (d-6), and (d-7), respectively, used as the coloring agent (D) were weighed and 67.3 g of MBA was added to this mixture, followed by stirring for dissolution. Subsequently, the resulting solution was filtrated through a filter with a pore size of 1 μm to provide a photosensitive resin composition P. The resulting photosensitive resin compositions were subjected to the evaluations (1) to (7) described above.

Comparative Example 7

Under yellow light, 6.3 g of the alkali-soluble resin (a-1) obtained in Synthesis example 2, used as the alkali-soluble resin (A), and 1.6 g of the photo acid generator obtained in Synthesis Example 14 were weighed, and 16.3 g of MBA were added to this mixture, followed by stirring for dissolution to provide a preliminary dispersion liquid. Then, 60.0 g of the pigment dispersion liquid (Dsp-1) obtained in Preparation example 1 was weighed and the preliminarily prepared liquid obtained above was added, followed by stirring to provide a uniform solution. Subsequently, the resulting solution was filtrated through a filter with a pore size of 1 μm to provide a photosensitive resin composition g. The final constitution of the resulting photosensitive resin composition g is given in Table 2. This photosensitive resin composition was subjected to the evaluations (1) to (7) described above.

Evaluations of results obtained in Examples and Comparative examples are given in Table 3.

TABLE 3

| | Photosensitive resin composition | Sensitivity (mJ/cm$^2$) | Heat resistance weight retaining rate (%) | Taper angle in cross-sectional shape θ (°) | Surface roughness (nm) | Optical density (OD value) | Luminescence characteristics of organic EL display device initial characteristics | characteristics after durability test |
|---|---|---|---|---|---|---|---|---|
| Example 1 | A | 50 | 84 | 51 | 2.0 | 1.5 | good | good |
| Example 2 | B | 60 | 86 | 55 | 2.0 | 1.5 | good | good |
| Example 3 | C | 50 | 86 | 53 | 2.0 | 1.5 | good | good |
| Example 4 | D | 45 | 86 | 45 | 2.0 | 1.5 | good | good |
| Example 5 | E | 35 | 86 | 38 | 2.0 | 1.5 | good | good |
| Example 6 | F | 80 | 86 | 60 | 2.0 | 1.5 | good | good |
| Example 7 | G | 35 | 82 | 44 | 2.0 | 1.5 | good | good |
| Example 8 | H | 60 | 80 | 52 | 2.0 | 1.5 | good | good |
| Example 9 | I | 45 | 82 | 38 | 1.5 | 1.5 | good | good |
| Example 10 | J | 45 | 83 | 40 | 1.5 | 1.5 | good | good |
| Example 11 | K | 50 | 83 | 40 | 1.5 | 1.5 | good | good |
| Example 12 | L | 50 | 84 | 51 | 2.0 | 1.5 | good | good |
| Example 13 | M | 40 | 84 | 40 | 1.5 | 1.5 | good | good |
| Example 14 | N | 30 | 86 | 30 | 1.5 | 0.3 | good | good |
| Example 15 | O | 80 | 80 | 60 | 3.0 | 3.0 | good | good |
| Example 16 | P | 30 | 86 | 55 | 1.0 | 0.3 | good | good |
| Example 17 | Q | 40 | 84 | 50 | 2.0 | 1.5 | good | good |
| Example 18 | R | 100 | 86 | 48 | 1.5 | 1.5 | good | good |
| Example 19 | S | 50 | 85 | 51 | 6.0 | 1.5 | good | good |
| Comparative example 1 | a | 100 | 85 | 83 | 2.5 | 1.5 | brightness irregularity found | not evaluated |
| Comparative example 2 | b | 70 | 90 | 86 | 3.5 | 1.5 | brightness irregularity found | not evaluated |
| Comparative example 3 | c | 40 | 63 | 30 | 1.5 | 1.5 | good | luminescence area 50% reduced |
| Comparative example 4 | d | 40 | 69 | 33 | 1.5 | 1.5 | good | luminescence area 30% reduced |

TABLE 3-continued

| | Photosensitive resin composition | Sensitivity (mJ/cm²) | Heat resistance weight retaining rate (%) | Taper angle in cross-sectional shape θ (°) | Surface roughness (nm) | Optical density (OD value) | Luminescence characteristics of organic EL display device initial characteristics | characteristics after durability test |
|---|---|---|---|---|---|---|---|---|
| Comparative example 5 | e | 70 | 87 | 75 | 1.5 | 0.3 | brightness irregularity found | not evaluated |
| Comparative example 6 | f | 160 | 81 | 95 | 5.0 | 3.0 | luminescence not found | not evaluated |
| Comparative example 7 | g | 850 | 88 | 30 | <1.0 | 1.5 | good | good |

Each negative type colored photosensitive resin composition obtained in Examples 1 to 19 had a weight retaining rate of 80% or more at 400° C., showing high heat resistance, and the cured film's cross section had a small taper angle θ of 60° or less. Compared to this, in Comparative examples 1, 5, and 6, where the polyimide precursor (a-9), which was used as the alkali-soluble resin (A), contained no trifluoro group in the backbone chain, and Comparative example 2, where a polyimide resin was used, the cured film's cross section had a large taper angle θ of 75° or more. In Comparative example 3, where only an acrylic resin was used as the alkali-soluble resin (A), and Comparative example 4, where only a cardo resin was used, each sample showed a weight retaining rate of 70% or less at 400° C., suggesting a lower heat resistance than in Examples. In Comparative example 7, where a positive colored photosensitive resin composition was used, the sensitivity was found to be largely lower than in Examples.

It can be seen that a higher sensitivity was achieved in Example 1, where a benzofuranone based black pigment was used, and Example 17, where a perylene based black pigment was used, than in Example 18, where carbon black was used as pigment. It can be seen that the smoothness (surface roughness) was particularly good, suggesting a very good pigment dispersion state in the composition, in Examples 1 to 15, 17, and 18, where a dispersing agent containing a tertiary amino group was used, than in Example 19, where the dispersing agent used had neither a tertiary amino group nor a nitrogen-containing heterocyclic basic functional group.

For Examples 1 to 19, furthermore, luminescence characteristics observations of the organic EL display device showed no defects such as non-luminescence and brightness irregularities in initial characteristics observations, and no deteriorations in luminescence characteristics were seen in the observations performed after durability test. Thus, good results were obtained. Compared to this, in Comparative examples 1, 2, 5, and 6, where the taper angle θ was a high 75° or more, non-luminescence or brightness irregularities were found in initial characteristics observations. The large taper angle might have led to a thickness reduction in the thin film layer or the second electrode near the boundary with the insulation layer or disconnection of the second electrode. In Comparative example 3, where only an acrylic resin was used as the alkali-soluble resin (A), and Comparative example 4, where only a cardo resin was used, good results were obtained without showing defects such as non-luminescence and brightness irregularities in initial characteristics observations, but a reduction in luminescence area was found after durability test in both cases. It was considered that degradation of the organic luminescent material was caused by gas generated from resin components with low heat resistance.

EXPLANATION OF NUMERALS

1: substrate
2: insulation layer
3: TFT
4: wiring
5: TFT insulation film
6: planarization layer
7: ITO
8: substrate
9: contact hole
10: insulation layer
11: glass substrate
12: first electrode
13: auxiliary electrode
14: insulation layer
15: organic EL layer
16: second electrode

The invention claimed is:
1. A negative type colored photosensitive resin composition comprising:
an alkali-soluble resin (A),
a photo initiator (B),
a photo polymerizable compound (C), and
a coloring agent (D),
wherein the alkali-soluble resin (A) contains a polyimide precursor, polybenzoxazole precursor, and/or a copolymer thereof (A-1),
wherein each resin (A-1) has a trifluoromethyl group in the backbone chain,
wherein the resin (A-1) contains a structure as represented by general formula (1) as a primary component:

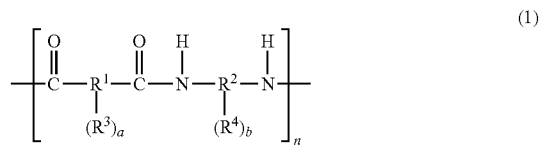

wherein $R^1$ and $R^2$ in general formula (1) independently denote a divalent to octavalent organic groups; $R^3$ and $R^4$ each denote a phenolic hydroxyl group, sulfonic acid group, thiol group, or $COOR^5$, which may be contained singly or different ones of which coexist; $R^5$ denotes a hydrogen atom or a monovalent hydrocarbon group having 1 to 20 carbon atoms; a and b each denote an integer of 0 to 6, where a+b>0; n denotes the range of 5 to 10,000; and at least one of the groups represented by $R^1\text{-}(R^3)_a$ and those by $R^2\text{-}(R^4)_b$ contains a trifluoromethyl group.

2. The negative type colored photosensitive resin composition as set forth in claim 1, wherein at least one selected from the group consisting of the groups represented by general formula (2) and groups represented by general formula (3) accounts for 20 mol % to 100 mol % of the total quantity, or 100 mol %, of the diamine residues containing a group represented by $R^2\text{-}(R^4)_b$ in general formula (1):

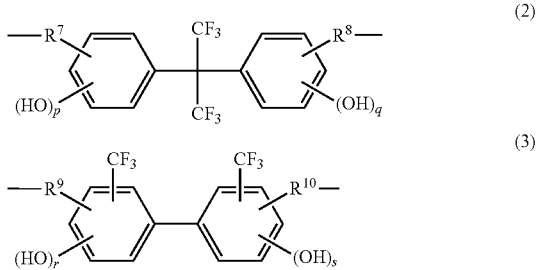

wherein $R^7$ to $R^{10}$ in general formulae (2) and (3) each denote a single bond or a divalent organic group containing 1 to 20 carbon atoms; and p, q, r, and s each denote 0 or 1.

3. The negative type colored photosensitive resin composition as set forth in claim 1, wherein groups represented by general formula (4) account for 20 mol % to 100 mol % of the total quantity, or 100 mol %, of the residues of acid components containing a group represented by $R^1\text{-}(R^3)_a$ in general formula (1):

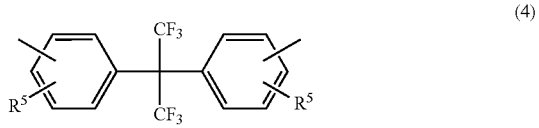

wherein $R^5$ in general formula (4) denotes a hydrogen atom or $COOR^6$, $R^6$ denoting a hydrogen atom or a monovalent hydrocarbon group having 1 to 20 carbon atoms.

4. The negative type colored photosensitive resin composition as set forth in claim 1, wherein the coloring agent (D) contains an organic pigment and/or an inorganic pigment and turns to black when the film is cured.

5. The negative type colored photosensitive resin composition as set forth in claim 4, wherein the coloring agent (D) contains a benzofuranone based black pigment and/or a perylene based black pigment.

6. The negative type colored photosensitive resin composition as set forth in claim 4 further comprising a dispersing agent (E), the dispersing agent containing a tertiary amino group or a nitrogen-containing heterocyclic basic functional group.

7. The negative type colored photosensitive resin composition as set forth in claim 1 further comprising a chain transfer agent (F).

8. The negative type colored photosensitive resin composition as set forth in claim 1, wherein the resin (A-1) further contains an alkylene oxide group in the backbone chain.

9. The negative type colored photosensitive resin composition as set forth in claim 1, wherein the alkali-soluble resin (A) further contains a radically polymerizable monomer-based polymer, siloxane resin, and/or cardo resin.

10. A cured film produced from the negative type colored photosensitive resin composition as set forth in claim 1.

11. A cured film as set forth in claim 10 having an optical density of 0.3 or more and 3.0 or less.

12. An element having the cured film as set forth in claim 10.

13. An organic EL display device comprising the cured film as set forth in claim 10 as at least one selected from the group consisting of planarization layers on a drive circuit and insulation layers on a first electrode.

14. A production method for a cured film comprising:
spreading the negative type colored photosensitive resin composition as set forth in claim 1 over a substrate to form a photosensitive resin film,
drying the photosensitive resin film,
exposing the dried photosensitive resin film to light,
developing the light-exposed photosensitive resin film, and
heat-treating the developed photosensitive resin film.

15. A production method for an organic EL display device comprising a step for forming a cured film by the method as set forth in claim 14, the cured film designed to serve as at least one selected from the group consisting of the planarization layers on the drive circuit and the insulation layers on the first electrode.

* * * * *